United States Patent
Kobayashi et al.

(10) Patent No.: US 8,013,338 B2
(45) Date of Patent: Sep. 6, 2011

(54) DISPLAY DEVICE AND ELECTRONIC DEVICE HAVING THE DISPLAY DEVICE, AND METHOD FOR MANUFACTURING THEREOF

(75) Inventors: Satoshi Kobayashi, Atsugi (JP); Atsushi Miyaguchi, Atsugi (JP); Yoshitaka Moriya, Atsugi (JP); Yoshiyuki Kurokawa, Sagamihara (JP); Daisuke Kawae, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 566 days.

(21) Appl. No.: 12/222,259

(22) Filed: Aug. 6, 2008

(65) Prior Publication Data
US 2009/0039352 A1     Feb. 12, 2009

(30) Foreign Application Priority Data
Aug. 7, 2007  (JP) .................................. 2007-205615

(51) Int. Cl.
*H01L 29/04* (2006.01)
(52) U.S. Cl. ......................................... 257/59; 438/149
(58) Field of Classification Search .................... 257/59; 438/149
See application file for complete search history.

(56) References Cited

U.S. PATENT DOCUMENTS

| 5,796,116 A  * | 8/1998 | Nakata et al. ................... 257/66 |
| 7,476,572 B2 * | 1/2009 | Morisue et al. ............... 438/149 |
| 2004/0188685 A1 | 9/2004 | Lin et al. |
| 2005/0048706 A1 * | 3/2005 | Shimomura et al. .......... 438/197 |

FOREIGN PATENT DOCUMENTS
JP    2007-005508    1/2007

OTHER PUBLICATIONS

International Search Report (Application No. PCT/JP2008/064173) Dated Nov. 11, 2008.
Written Opinion (Application No. PCT/JP2008/064173) Dated Nov. 11, 2008.

* cited by examiner

*Primary Examiner* — Douglas M Menz
(74) *Attorney, Agent, or Firm* — Eric J. Robinson; Robinson Intellectual Property Law Office, P.C.

(57) ABSTRACT

To provide a display device including a thin film transistor in which high electric characteristics and reduction in off-current can be achieved. The display device having a thin film transistor includes a substrate, a gate electrode provided over the substrate, a gate insulating film provided over the gate electrode, a microcrystalline semiconductor film provided over the gate electrode with the gate insulating film interposed therebetween, a channel protection layer which is provided over and in contact with the microcrystalline semiconductor film, an amorphous semiconductor film provided over the gate insulating film and on a side surface of the microcrystalline semiconductor film and the channel protection layer, an impurity semiconductor layer provided over the amorphous semiconductor film, and a source electrode and a drain electrode provided over and in contact with the impurity semiconductor layer. The thickness of the amorphous semiconductor film is larger than that of the microcrystalline semiconductor film.

18 Claims, 16 Drawing Sheets

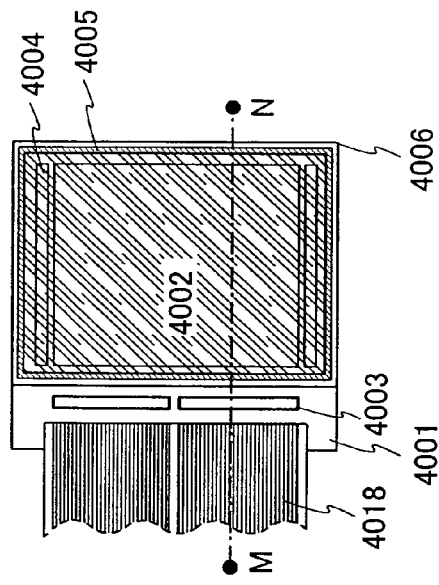
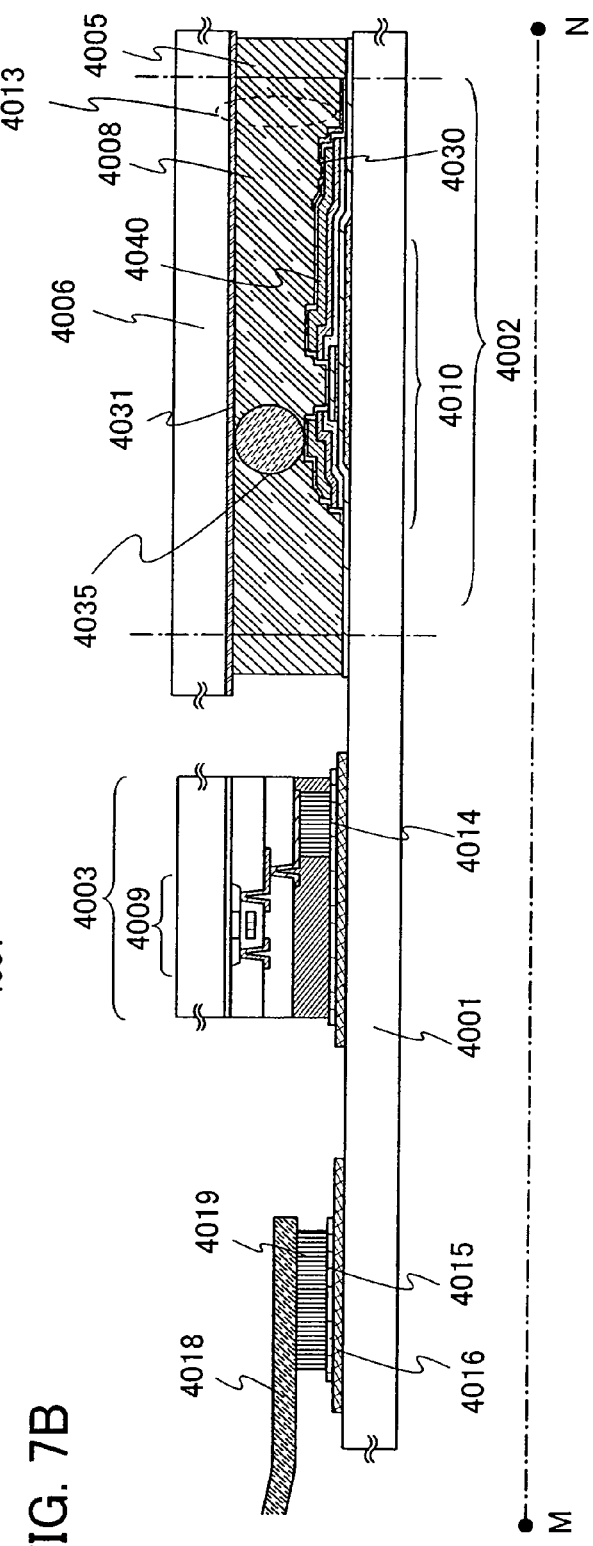
FIG. 7A
FIG. 7B

DISPLAY DEVICE AND ELECTRONIC DEVICE HAVING THE DISPLAY DEVICE, AND METHOD FOR MANUFACTURING THEREOF

BACKGROUND OF THE INVENTION

1. Field of the Invention

The present invention relates to a display device and an electronic device using the display device. In particular, the present invention relates to a display device using a thin film transistor in a pixel portion and an electronic device using the display device.

2. Description of the Related Art

In recent years, techniques that are used to form thin film transistors using a semiconductor thin film (with a thickness of approximately several nanometers to several hundreds of nanometers) which is formed over a substrate with an insulating surface have been put into practice in many electronic devices. In particular, thin film transistors have been put into practical use as switching elements in a pixel portion of a display device, and research and development has been actively conducted.

As a switching element of a liquid crystal display device, a thin film transistor using an amorphous semiconductor film in a large panel or a thin film transistor using a polycrystalline semiconductor film in a small panel is used. As a method for forming a polycrystalline semiconductor film, there is known a technique in which a pulsed excimer laser beam is shaped into a linear laser beam by an optical system, and an amorphous semiconductor film is crystallized by being irradiated while being scanned with the linear laser beam.

As a switching element of an image display device, a thin film transistor using a microcrystalline semiconductor film is used (Reference 1: Japanese Published Patent Application No. H4-242724, Reference 2: Japanese Published Patent Application No. 2005-49832, and Reference 3: U.S. Pat. No. 5,591,987). In addition, as a method for manufacturing a thin film transistor for improvement of characteristics of an amorphous semiconductor film, a method is known in which an amorphous silicon film is formed over a gate insulating film, and then a metal film is formed thereover, and the metal film is irradiated with a diode laser beam to modify the amorphous silicon film into a microcrystalline silicon film (Non-Patent Document 1: Toshiaki Arai et al., SID 07 digest, 2007, pp. 1370-1373). According to this method, the metal film formed over the amorphous silicon film is provided to convert light energy of the diode laser beam into thermal energy and should be removed in a later step to complete a thin film transistor. That is, the method is that in which the amorphous silicon film is heated only by conduction heating from the metal film, thereby forming a microcrystalline silicon film that is a microcrystalline semiconductor film.

SUMMARY OF THE INVENTION

A thin film transistor using a polycrystalline semiconductor film has advantages in that mobility is two or more orders of magnitude greater than that of a thin film transistor using an amorphous semiconductor film, and a pixel portion of a display device and peripheral driver circuits thereof can be formed over the same substrate. However, the process for crystallization of a semiconductor film is more complex than that in the case of using an amorphous semiconductor film. Accordingly, there are problems in that yield is decreased and cost is increased.

There is also a problem in that the surface of a microcrystalline semiconductor film is likely to be oxidized. Therefore, when crystal grains in a channel formation region are oxidized, oxide films are formed on the surfaces of the crystal grains and the oxide films become obstacles to carrier transfer, which causes a problem in that electric characteristics of a thin film transistor are impaired. In addition, there is a problem in that it is difficult to increase the thickness of the microcrystalline semiconductor film as compared to that of an amorphous semiconductor film or of a polycrystalline semiconductor film and parasitic capacitance between a gate electrode and a source electrode and/or a drain electrode is caused to be increased.

In terms of ease of production, a thin film transistor having an inverted staggered structure is promising as a switching element that is provided in a pixel portion of a display device. From the viewpoint of improvement in aperture ratio of a pixel, while a thin film transistor having an inverted staggered structure is expected to have high performance and to be downsized, there is a problem in that leakage current (also referred to as off-current) flowing between a source region and a drain region is increased when the thin film transistor is in an off state. Therefore, there is a problem in that it is difficult to downsize the size of the thin film transistor, to reduce a storage capacitor, and to decrease power consumption.

In view of the foregoing problems, an object of the present invention is to provide a display device including a thin film transistor in which the decrease in yield and the increase in parasitic capacitance and in production cost are suppressed, high electric characteristics and reduction in off-current are achieved.

One feature of the present invention is a display device having a thin film transistor, including: a gate electrode provided over a substrate; a gate insulating film provided over the gate electrode; a microcrystalline semiconductor film provided over the gate electrode with the gate insulating film interposed therebetween; a channel protection layer which is provided over the microcrystalline semiconductor film and which is in contact with the microcrystalline semiconductor film; an amorphous semiconductor film provided over the gate insulating film and on a side surface of the microcrystalline semiconductor film and the channel protection layer; an impurity semiconductor layer provided over the amorphous semiconductor film; and a source electrode and a drain electrode each provided in contact with the impurity semiconductor layer. The thickness of the amorphous semiconductor film is larger than the thickness of the microcrystalline semiconductor film.

Another feature of the present invention is a display device having a thin film transistor, including: a gate electrode provided over a substrate; a gate insulating film provided over the gate electrode; a microcrystalline semiconductor film provided over the gate electrode with the gate insulating film interposed therebetween; a channel protection layer which is provided over the microcrystalline semiconductor film and which is in contact with the microcrystalline semiconductor film; an amorphous semiconductor film provided over the gate insulating film and on a side surface of the microcrystalline semiconductor film and the channel protection layer; an impurity semiconductor layer provided over the amorphous semiconductor film; and a source electrode and a drain electrode each provided in contact with the impurity semiconductor layer. The thickness of the amorphous semiconductor film is larger than the thickness of the microcrystalline semiconductor film, a part of the impurity semiconductor layer and a part of the amorphous semiconductor film are exposed outside the source electrode and the drain electrode, and one of end portions of the impurity semiconductor layer and one of end portions of the amorphous semiconductor film are aligned with each other over the gate electrode.

Another feature of the present invention is a display device having a thin film transistor, including: a gate electrode provided over a substrate; a gate insulating film provided over the gate electrode; a microcrystalline semiconductor film provided over the gate electrode with the gate insulating film interposed therebetween; a channel protection layer which is provided over the microcrystalline semiconductor film and which is in contact with the microcrystalline semiconductor film; an amorphous semiconductor film provided over the gate insulating film and on a side surface of the microcrystalline semiconductor film and the channel protection layer; an impurity semiconductor layer provided over the amorphous semiconductor film; a source electrode and a drain electrode each provided in contact with the impurity semiconductor layer; an insulating film which is in contact with the source electrode, the drain electrode, the impurity semiconductor layer, and the amorphous semiconductor film; and a pixel electrode which is formed over the insulating film and connected to one of the source electrode and the drain electrode in a contact hole formed in the insulating film. The thickness of the amorphous semiconductor film is larger than the thickness of the microcrystalline semiconductor film.

Another feature of the present invention is a display device having a thin film transistor, including: a gate electrode provided over a substrate; a gate insulating film provided over the gate electrode; a microcrystalline semiconductor film provided over the gate electrode with the gate insulating film interposed therebetween; a channel protection layer which is provided over the microcrystalline semiconductor film and which is in contact with the microcrystalline semiconductor film; an amorphous semiconductor film provided over the gate insulating film and on a side surface of the microcrystalline semiconductor film and the channel protection layer; an impurity semiconductor layer provided over the amorphous semiconductor film; a source electrode and a drain electrode each provided in contact with the impurity semiconductor layer; an insulating film which is in contact with the source electrode, the drain electrode, the impurity semiconductor layer, and the amorphous semiconductor film; and a pixel electrode which is formed over the insulating film and connected to one of the source electrode and the drain electrode in a contact hole formed in the insulating film. The thickness of the amorphous semiconductor film is larger than the thickness of the microcrystalline semiconductor film, a part of the impurity semiconductor layer and a part of the amorphous semiconductor film are exposed outside the source electrode and the drain electrode, and one of end portions of the impurity semiconductor layer and one of end portions of the amorphous semiconductor film are aligned with each other over the gate electrode.

Note that, in the display device of the present invention, the channel protection layer may be one of a silicon nitride film and a silicon nitride oxide film.

Because of misalignment of the edge portions of the source electrode and the drain electrode with the edge portions of the impurity semiconductor layer and formation of the edge portions of the impurity semiconductor layer outside the edge portions of the source electrode and the drain electrode, the edge portions of the source electrode and the drain electrode are apart from each other; accordingly, leakage current and a short circuit between the source electrode and the drain electrode can be prevented. In addition, an electric field can be prevented from being concentrated on the edge portions of the source electrode and the drain electrode and the impurity semiconductor layer, and leakage current between the gate electrode and the source electrode and/or the drain electrode can be prevented.

In addition, an amorphous semiconductor layer is provided on a side surface of a microcrystalline semiconductor film and a channel protection layer. Since the amorphous semiconductor layer is provided, the distance of the impurity semiconductor layer that serves as a source region and a drain region can be long, and leakage current flowing the impurity semiconductor layer can be reduced. Further, since the amorphous semiconductor layer is provided, the thickness between a gate electrode and a source electrode and/or a drain electrode can be made large; therefore, parasitic capacitance generated between the gate electrode and the source electrode and/or the drain electrode can be reduced.

Over the microcrystalline semiconductor film, a channel protection layer is provided in contact with the microcrystalline semiconductor film. The microcrystalline semiconductor film functions as a channel formation region. The channel protection layer prevents oxidation of the microcrystalline semiconductor film and functions as an etching stopper in manufacturing process of a thin film transistor. Since the channel protection layer is provided in contact with the microcrystalline semiconductor film, the thickness of the microcrystalline semiconductor film can be made small and the oxidation of crystal grains contained in the microcrystalline semiconductor film can be prevented; therefore, a thin film transistor which has high mobility, small leakage current, and high withstand voltage can be obtained.

Unlike a polycrystalline semiconductor film, a microcrystalline semiconductor film can be directly formed on a substrate as a microcrystalline semiconductor film. Specifically, a microcrystalline semiconductor film can be formed using silicon hydride as a source gas and using a plasma CVD apparatus. The microcrystalline semiconductor film formed by the above method includes a microcrystalline semiconductor film which contains crystal grains of 0.5 nm to 20 nm in an amorphous semiconductor. Thus, unlike in the case of using a polycrystalline semiconductor film, there is no need to provide a crystallization process after formation of a semiconductor film. The number of steps in manufacture of a thin film transistor can be reduced; yield of a display device can be increased; and cost can be lowered. Plasma using a microwave with a frequency of 1 GHz or more has high electron density, which facilitates dissociation of silicon hydride that is a source gas. Therefore, compared to a microwave plasma CVD method with a frequency of several tens to several hundreds of megahertz, the microcrystalline semiconductor film can be formed more easily and film formation rate can be increased. Thus, the mass productivity of display devices can be increased.

In addition, thin film transistors (TFTs) are formed using a microcrystalline semiconductor film, and a display device is manufactured using the thin film transistors in a pixel portion and also in driver circuits. Because thin film transistors using a microcrystalline semiconductor film each have a mobility of 1 $cm^2$/V·sec to 20 $cm^2$/V·sec, which is 2 to 20 times greater than that of a thin film transistor using an amorphous semiconductor film, some of or all of the driver circuits can be formed over the same substrate as the pixel portion to form a system-on-panel display.

The display device includes a liquid crystal element or a light-emitting element (generally called a display element). In addition, the display device includes a panel in which a display element is sealed, and a module in which an IC and the like including a controller are mounted on the panel. The present invention further relates to one mode of an element substrate before the display element is completed in a manufacturing process of the display device, and the element substrate is provided with a means to supply voltage to the display element in each of a plurality of pixels. An element substrate may be specifically in a state where only a pixel electrode of a display element is formed or in a state after a conductive film to serve as a pixel electrode is formed and before the conductive film is etched into a pixel electrode, and any mode is possible.

Note that display devices in this specification refer to image display devices and light sources (including lighting devices). In addition, display devices include all of the following modules: modules provided with a connector, for example, a flexible printed circuit (FPC), a tape automated bonding (TAB) tape, or a tape carrier package (TCP); modules provided with a printed wiring board at the end of a TAB tape or a TCP; and modules where an integrated circuit (IC) is directly mounted on a display element by a chip-on-glass (COG) method.

The present invention can provide a display device including a thin film transistor in which reduction in yield can be suppressed, an increase in parasitic capacitance and production cost can be suppressed, high electric characteristics can be achieved, and off-current can be reduced.

BRIEF DESCRIPTION OF THE DRAWINGS

FIGS. 7A and 7B are diagrams illustrating a display device of the present invention.

DETAILED DESCRIPTION OF THE INVENTION

Hereinafter, embodiment modes of the present invention will be described with reference to the accompanying drawings. However, the present invention can be implemented in various modes. As can be easily understood by those skilled in the art, the modes and details of the present invention can be changed in various ways without departing from the spirit and scope of the present invention. Thus, the present invention should not be taken as being limited to the following description of the embodiment modes.

Embodiment Mode 1

Figure 3A:
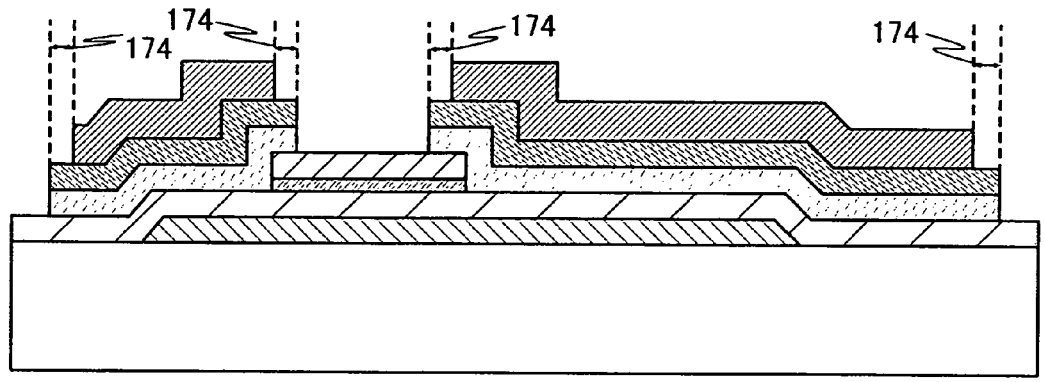
FIGS. 3A to 3C are cross-sectional views illustrating a method for manufacturing a display device of the present invention.
Figure 4:
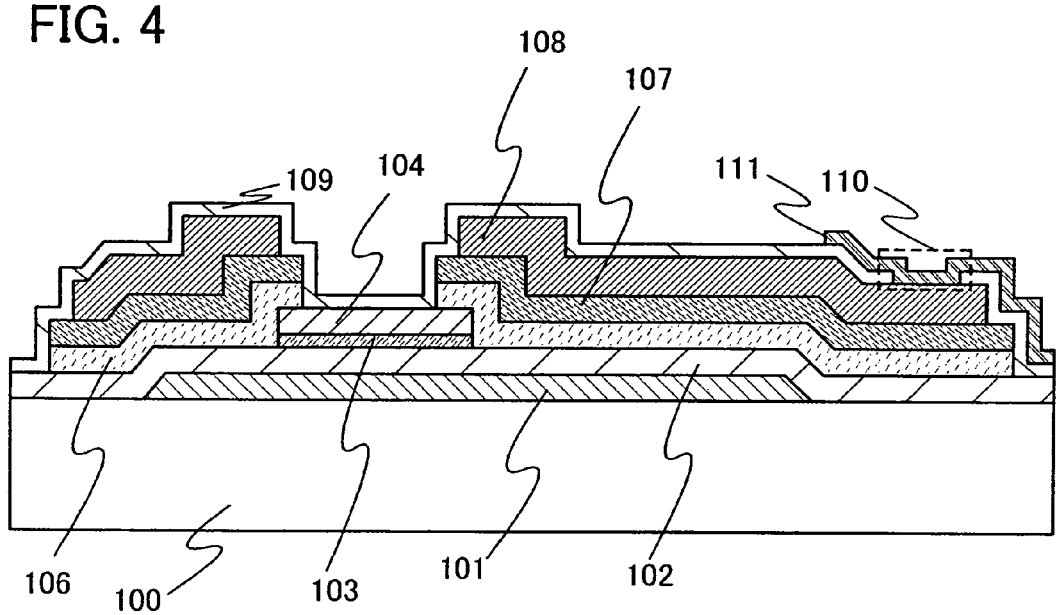
FIG. 4 is a cross-sectional view illustrating a method for manufacturing a display device of the present invention.
Figure 5A:
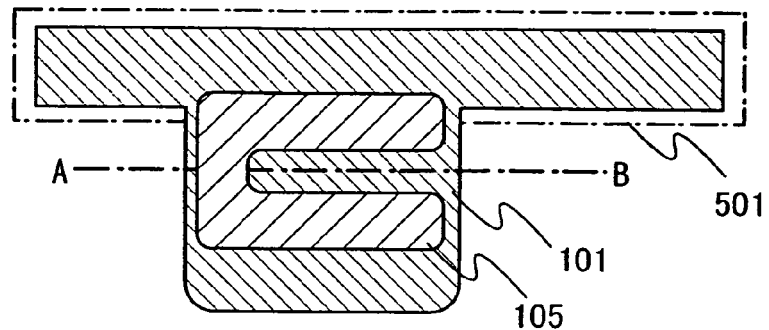
FIGS. 5A to 5C are top views illustrating a display device of the present invention.
Figure 5B:
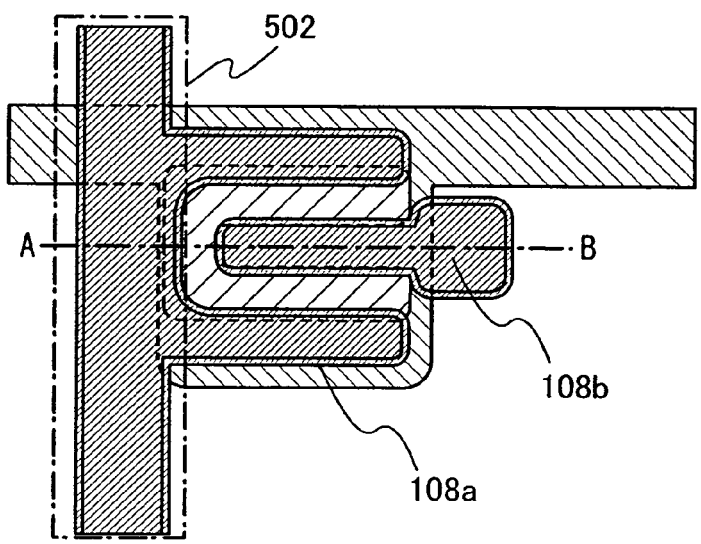
Figure 5C:
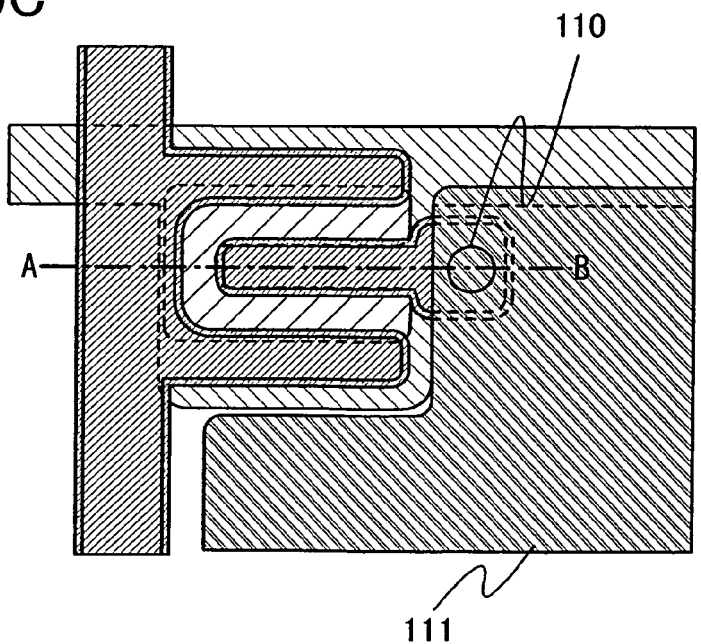

In this embodiment mode, manufacturing processes of thin film transistors used for a display device will be described with reference to FIGS. 1A to 1C, FIGS. 2A to 2C, FIGS. 3A to 3C, FIG. 4, and FIGS. 5A to 5C. FIGS. 1A to 1C, FIGS. 2A to 2C, FIGS. 3A to 3C, and FIG. 4 are cross-sectional views illustrating manufacturing processes of thin film transistors, and FIGS. 5A to 5C are top views each illustrating a connection region of a thin film transistor in one pixel of a display device and a pixel electrode.

A thin film transistor having a microcrystalline semiconductor film, which is of an n type, is more suitable for use in a driver circuit than that of a p type because it has higher mobility. It is desired that all thin film transistors formed over the same substrate have the same polarity, in order to reduce the number of steps. Here, description is made using n-channel thin film transistors.

Figure 1A:
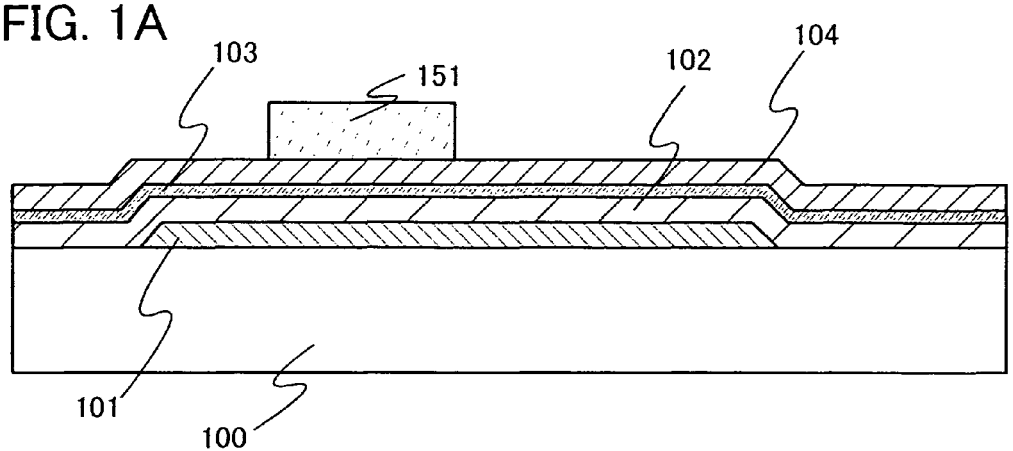
FIGS. 1A to 1C are cross-sectional views illustrating a method for manufacturing a display device of the present invention.

As shown in FIG. 1A, a gate electrode 101 is formed over a substrate 100. As the substrate 100, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. Alternatively, metal substrates of a stainless-steel alloy and the like with the surface provided with an insulating film may be employed. When the substrate 100 is mother glass, the substrate may have any of the following sizes: the first generation (320 mm×400 mm), the second generation (400 mm×500 mm), the third generation (550 mm×650 mm), the fourth generation (680 mm×880 mm, or 730 mm×920 mm), the fifth generation (1000 mm×1200 mm, or 1100 mm×1250 mm), the sixth generation (1500 mm×1800 mm), the seventh generation (1900 mm×2200 mm), the eighth generation (2160 mm×2460 mm), the ninth generation (2400 mm×2800 mm, or 2450 mm×3050 mm), the tenth generation (2950 mm×3400 mm), and the like.

The gate electrode 101 is formed using a metal material such as titanium, molybdenum, chromium, tantalum, tungsten, or aluminum; or an alloy material thereof. The gate electrode 101 can be formed in such a manner that a conductive film is formed over the substrate 100 by a sputtering method or a vacuum evaporation method; a mask is formed over the conductive film by a photolithography technique or an inkjet method; and the conductive film is etched using the mask. Note that, as barrier metal which increases adhesion of the gate electrode 101 and prevents diffusion to a base, a nitride film of the above-mentioned metal material may be provided between the substrate 100 and the gate electrode 101. Here, the gate electrode is formed by etching of the conductive film formed over the substrate 100 with the use of a resist mask formed using a first photomask.

Note that, because a semiconductor film and a wiring are to be formed over the gate electrode 101, it is desired that the gate electrode 101 be processed so that its edge portions are tapered in order to prevent disconnection. Although not shown, in this step, a wiring connected to the gate electrode can also be formed at the same time.

Next, over the gate electrode 101, a gate insulating film 102, a microcrystalline semiconductor film 103, and a channel protection layer 104 are formed in this order. Then, a resist 151 is applied on the channel protection layer 104. Note that it is preferable that at least the gate insulating film 102, the microcrystalline semiconductor film 103, and the channel protection layer 104 be formed successively. By successive formation of at least the gate insulating film 102, the microcrystalline semiconductor film 103, and the channel protection layer 104 without any exposure to the atmosphere, each interface between stacked layers can be formed without being contaminated by an atmospheric constituent or a contaminant impurity element floating in the atmosphere. Thus, variations in characteristics of thin film transistors can be reduced.

The gate insulating film 102 can be formed by a CVD method, a sputtering method, or the like using a silicon oxide film, a silicon nitride film, a silicon oxynitride film, or a silicon nitride oxide film. Note that the gate insulating film 102 can be formed not by a single layer but by two-stacked layers of a silicon oxide film or a silicon oxynitride film, and a silicon nitride film or a silicon nitride oxide film in this order. Note that the gate insulating film can be formed by stacking not two layers but three layers of a silicon nitride film or a silicon nitride oxide film, a silicon oxide film or a silicon oxynitride film, and a silicon nitride film or a silicon nitride oxide film in this order from the substrate side.

Here, a silicon oxynitride film means a film that contains more oxygen than nitrogen and includes oxygen, nitrogen, silicon, and hydrogen at concentrations ranging from 55 at. % (atomic percent) to 65 at. %, 1 at. % to 20 at. %, 25 at. % to 35 at. %, and 0.1 at. % to 10 at. %, respectively. Further, a silicon nitride oxide film means a film that contains more nitrogen than oxygen and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

The microcrystalline semiconductor film 103 is a film which contains a semiconductor having an intermediate structure between amorphous and crystalline structures (including a single crystal and a polycrystal). This semiconductor is a semiconductor which has a third state that is stable in terms of free energy, and is a crystalline semiconductor that has short-range order and lattice distortion, and a columnar crystal or needle crystal having crystal grains with a diameter of 0.5 nm to 20 nm is grown in the direction of the normal to a substrate surface. In addition, a microcrystalline semiconductor and a non-single crystal semiconductor coexist. Microcrystalline silicon, which is a typical example of a microcrystalline semiconductor, has a Raman spectrum that is shifted to a lower wave number side than 521 cm$^{-1}$ that represents single-crystal silicon. That is, the peak of a Raman spectrum of microcrystalline silicon is between 480 cm$^{-1}$ that shows amorphous silicon and 521 cm$^{-1}$ that shows single-crystal silicon. In addition, microcrystalline silicon is made to contain hydrogen or halogen of at least 1 at. % or more for termination of dangling bonds. Moreover, microcrystalline silicon is made to contain a noble gas element such as helium, argon, krypton, neon, or the like to further enhance lattice distortion, whereby stability is increased and a favorable microcrystalline semiconductor film can be obtained. Such a microcrystalline semiconductor film is disclosed in, for example, U.S. Pat. No. 4,409,134.

The microcrystalline semiconductor film can be formed by a high-frequency plasma CVD method with a frequency of several tens to several hundreds of megahertz or a microwave plasma CVD apparatus with a frequency of 1 GHz or more. The microcrystalline semiconductor film can be typically formed using a dilution of silicon hydride such as $SiH_4$, $Si_2H_6$, or the like with hydrogen. With a dilution with one or plural kinds of noble gas elements selected from helium, argon, krypton, and neon in addition to silicon hydride and hydrogen, the microcrystalline semiconductor film can be formed. In that case, the flow ratio of hydrogen to silicon hydride is set to be 50:1 to 1000:1, preferably, 50:1 to 200:1, more preferably, 100:1. Note that, in place of silicon hydride, $SiH_2Cl_2$, $SiHCl_3$, $SiCl_4$, $SiF_4$, or the like can be used.

A microcrystalline semiconductor film exhibits weak n-type electrical conductivity when an impurity element for valence control is not intentionally added. Thus, threshold control of a microcrystalline semiconductor film which functions as a channel formation region of a thin film transistor can be achieved by addition of an impurity element that imparts p-type conductivity at the same time as or after the film formation. A typical example of an impurity element that imparts p-type conductivity is boron, and an impurity gas such as $B_2H_6$, $BF_3$, or the like may be mixed into silicon hydride at a proportion of 1 ppm to 1000 ppm, preferably, 1 ppm to 100 ppm. The concentration of boron may be set to be, for example, $1\times10^{14}$ atoms/cm$^3$ to $6\times10^{16}$ atoms/cm$^3$.

The oxygen concentration of the microcrystalline semiconductor film is preferably set at $5\times10^{19}$ cm$^{-3}$ or less, more preferably, $1\times10^{19}$ cm$^{-3}$ or less, and each of the nitrogen concentration and the carbon concentration is preferably set at $3\times10^{18}$ cm$^{-3}$ or less. By decreases in concentrations of oxygen, nitrogen, and carbon to be mixed into the microcrystalline semiconductor film, the microcrystalline semiconductor film can be prevented from being changed into an n type.

The microcrystalline semiconductor film 103 is formed at a thickness of 1 nm or more and 50 nm or less, preferably, 5 nm or more and 20 nm or less. The microcrystalline semiconductor film 103 functions as a channel formation region of a thin film transistor to be formed later. When the thickness of the microcrystalline semiconductor film 103 is within the range from 5 nm to 50 nm, a thin film transistor to be formed later is to be a fully depleted type. In addition, because the formation rate of the microcrystalline semiconductor film 103 is low, i.e., a tenth to a hundredth of that of an amorphous semiconductor film, a decrease in thickness leads to an increase in throughput. Furthermore, because the microcrystalline semiconductor film contains microcrystals, it has lower resistance than an amorphous semiconductor film. Therefore, a thin film transistor using the microcrystalline semiconductor film has current-voltage characteristics represented by a curve with a steep slope in a rising portion, has an excellent response as a switching element, and can be operated at high speed. With the use of the microcrystalline semiconductor film in a channel formation region of a thin film transistor, fluctuation of a threshold voltage of a thin film transistor can be suppressed. Therefore, a display device with less variation of electrical characteristics can be manufactured.

The microcrystalline semiconductor film has higher mobility than an amorphous semiconductor film. Thus, with the use of a thin film transistor, a channel formation region of which is formed of the microcrystalline semiconductor film, for switching of a liquid crystal element that is a display element, the area of the channel formation region, that is, the area of the thin film transistor can be decreased. Accordingly, the area of the thin film transistor in a single pixel is decreased, and an aperture ratio of the pixel can be increased.

Note that, for an improvement in electric characteristics of the microcrystalline semiconductor film, the gate insulating film may be irradiated with a laser beam from a surface side of the microcrystalline semiconductor. The laser beam illuminates in the energy density that microcrystalline semiconductor film does not melt. That is, laser process to the microcrystalline semiconductor film is performed by solid-phase crystal growth without melting the microcrystalline semiconductor film by radiant heating. In other words, it is to use a critical region in which the deposited microcrystalline semiconductor film does not become a liquid phase, and it can be referred to as "critical growth" in the meaning.

A laser beam can operate up to the interface between the microcrystalline semiconductor film and the gate insulating film. Accordingly, when crystal in the surface side of the microcrystalline semiconductor film is used as a seed, solid-phase crystal growth proceeds from the surface to the interface of the gate insulating film, and substantially columnar crystal grows. The solid-phase crystal growth by laser process does not enlarge the grain size but rather improves the crystallinity in the direction of film thickness. A laser beam is converged in a rectangular long shape (a linear laser beam), and laser process can be performed in such a way that a microcrystalline semiconductor film over a glass substrate of 730 mm×920 mm is scanned by one laser beam, for example. In this case, a rate (overlap rate) for overlapping a linear laser beam is set at 0% to 90% (preferably, 0% to 67%). Thus, processing time for each substrate is shortened, and productivity can be improved. The shape of a laser beam is not limited to a linear shape, and a planar laser beam can also be used to perform the treatment similarly. In addition, this laser process is not limited to the size of the above glass substrate and can be applied to various sizes. Because of the laser process, the crystallinity in the interface region of the gate insulating film is improved, and electric characteristics of a transistor having a bottom gate structure can be improved. In such a critical growth, conventional unevenness (a projecting body referred to as a ridge) at the surface which has been seen in low temperature polycrystalline silicon is not formed and the smoothness of the surface of the semiconductor film after laser process is kept. As in this embodiment mode, a crystalline semiconductor film, which is obtained in such a way that a microcrystalline semiconductor film after film formation is irradiated with a laser beam directly, is clearly different from the deposited microcrystalline semiconductor film and a microcrystalline semiconductor film (described in Non-Patent Document 1) which is improved by conduction heating, in the growth mechanism and film quality. In this specification, the microcrystalline semiconductor film after film formation (semi amorphous semiconductor: SAS) which is subjected to laser process (hereinafter referred to as "LP") is generally referred to as an LPSAS (laser process semi amorphous semiconductor).

The channel protection layer 104 is formed of a silicon nitride film or a silicon nitride oxide film at a thickness of 400 nm or less, preferably, 50 nm or more and 200 nm or less. For example, the silicon nitride film is formed using $SiH_4$ and $NH_3$ as a source gas by a plasma CVD method. The silicon nitride oxide film is formed using $SiH_4$, $N_2O$, and $NH_3$ by a plasma CVD method. Since the channel protection layer 104 is provided in contact with the microcrystalline semiconductor film, the channel protection layer 104 is formed of a silicon nitride film or a silicon nitride oxide film, whereby an effect of preventing diffusion of impurities to the microcrystalline semiconductor film can be obtained and oxidation at the surface of crystal grains contained in the microcrystalline semiconductor film can be prevented. Further, the channel protection layer 104 is provided, whereby oxidation at the surface of the microcrystalline semiconductor film can be prevented; therefore, the thickness of the microcrystalline semiconductor film can be made small. Accordingly, since a thin film transistor in this embodiment mode can be operated as a complete depletion type transistor, leakage current when the transistor is turned off can be reduced.

Figure 6:
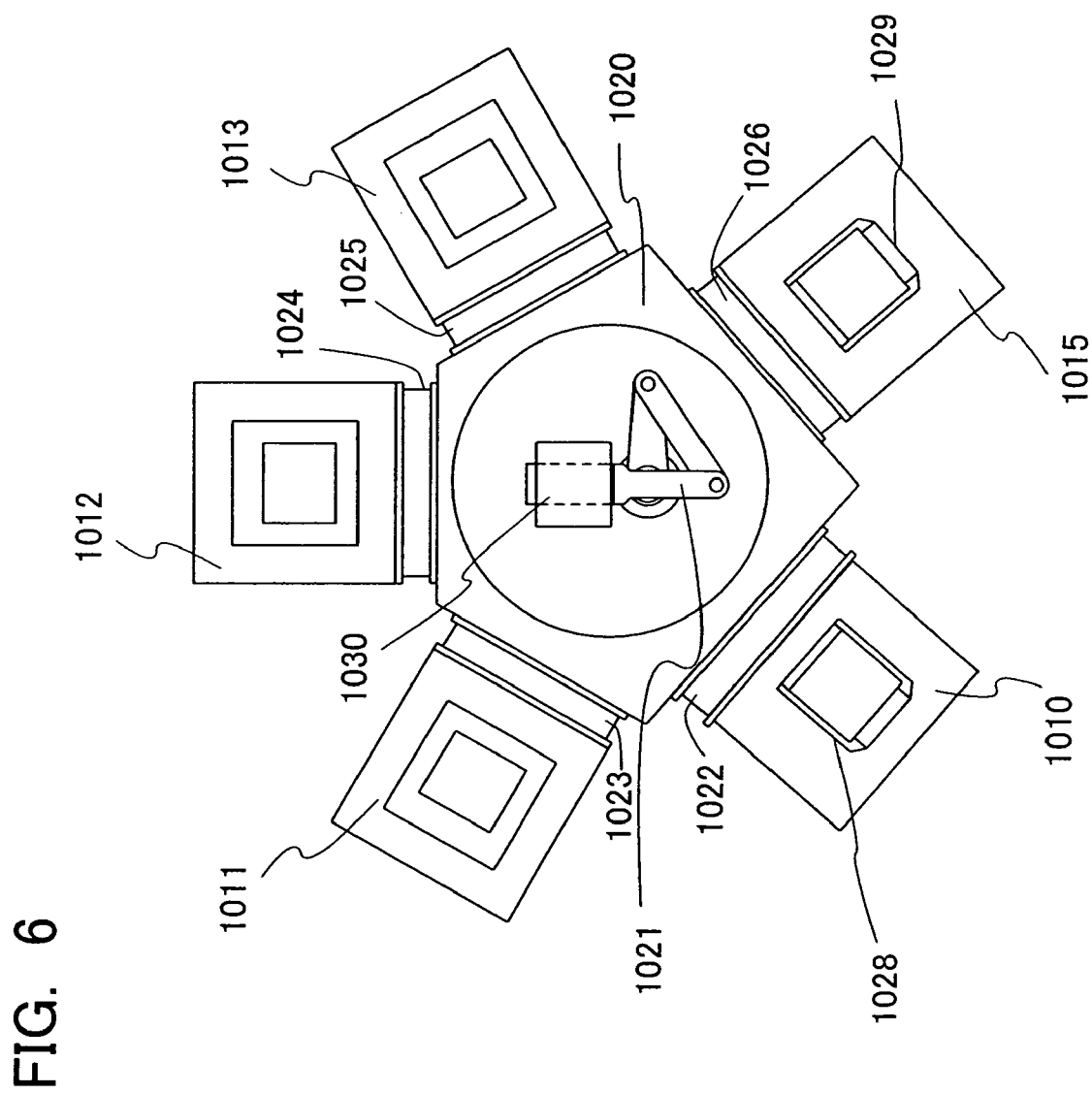
FIG. 6 is a top view illustrating a microwave plasma CVD apparatus.

Here, a plasma CVD apparatus, with which from the gate insulating film 102 to the channel protection layer 104 can be formed successively, is described with reference to FIG. 6. FIG. 6 is a schematic diagram showing an upper cross-sectional view of a plasma CVD apparatus, which has a structure where a loading chamber 1010, an unloading chamber 1015, and a reaction chamber (1) 1011, a reaction chamber (2) 1012, and a reaction chamber (3) 1013 are provided around a common chamber 1020. Between the common chamber 1020 and the other chambers, gate valves 1022, 1023, 1024, 1025, and 1026 are provided so that processes performed in the chambers do not interface with each other. Substrates are loaded into a cassette 1028 in the loading chamber 1010 and a cassette 1029 in the unloading chamber 1015 and carried to the reaction chambers (1) 1011 to (3) 1013 with a transport means 1021 of the common chamber 1020. In this apparatus, a reaction chamber can be provided for each kind of films to be deposited, and a plurality of different films can be formed successively without any exposure to the atmosphere. As an example, it is possible to provide a structure in which the gate insulating film 102 is formed in the reaction chamber (1) 1011, the microcrystalline semiconductor film 103 is formed in the reaction chamber (2) 1012, and the channel protection layer 104 is formed in the reaction chamber (3) 1013.

In this manner, with a microwave plasma CVD apparatus where a plurality of chambers is connected, the gate insulating film 102, the microcrystalline semiconductor film 103, and the channel protection layer 104 can be formed at the same time. Thus, mass productivity can be improved. In addition, even when maintenance or cleaning is performed in one of reaction chambers, film formation processes can be performed in the other reaction chambers, whereby cycle time for film formation can be shortened. Furthermore, each interface between stacked layers can be formed without being contaminated by an atmospheric constituent or a contaminant impurity element floating in the atmosphere. Thus, variations in characteristics of thin film transistors can be reduced.

Note that the plasma CVD apparatus shown in FIG. 6 is provided with the loading chamber and the unloading chamber separately, which may be a single loading/unloading chamber. In addition, the plasma CVD apparatus may be provided with a plurality of spare chambers. By preheating of a substrate in the spare chamber, heating time needed before film formation in each reaction chamber can be shortened; thus, throughput can be improved.

Figure 1B:
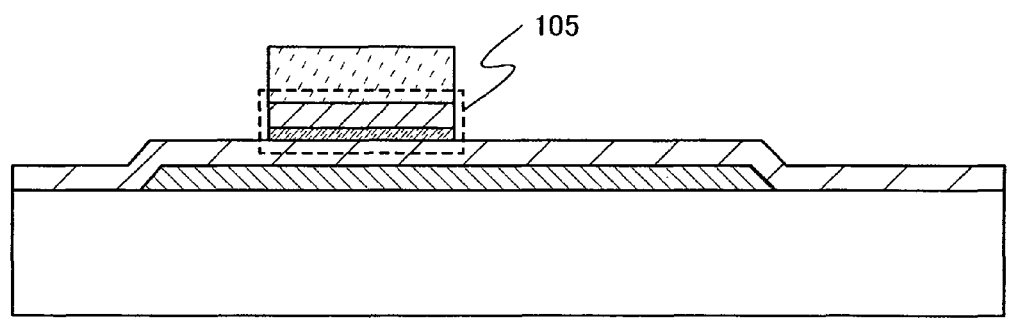

FIG. 1A will be described again. For the resist 151 in FIG. 1A, a positive resist or a negative resist can be used. In this embodiment mode, a positive resist is used. Then, a second photomask is used, and a resist mask in which the resist 151 is processed as shown in FIG. 1A is formed. Then, as shown in FIG. 1B, the microcrystalline semiconductor film 103 and the channel protection layer 104 are etched by the resist mask formed over the channel protection layer, and an island-shaped microcrystalline semiconductor film 105 is formed over the gate electrode 101. Note that FIG. 1B corresponds to a cross-sectional view taken along line A-B of FIG. 5A (however, the resist 151 and the gate insulating film 102 are excluded). Note that, in this specification, an island-shaped crystalline semiconductor film in which a microcrystalline semiconductor film and a channel protection layer are stacked is described. Note that a scan line 501 is shown in FIG. 5A, and the scan line 501 and the gate electrode 101 are electrically connected to each other.

Note that the side surface of each end portion of the island-shaped microcrystalline semiconductor film 105 is tilted, whereby good electric connection between an amorphous semiconductor film that is formed on the side surfaces of the island-shaped microcrystalline semiconductor film and the microcrystalline semiconductor film at the bottom portion of the island-shape microcrystalline semiconductor film 105 can be obtained. The angle of inclination of the side surface of each end portion of the island-shaped microcrystalline semiconductor film. 105 is set at 30° to 90°, preferably, 45° to 80°. With such an angle, a disconnection of a source electrode or a drain electrode due to a step shape can be prevented.

Figure 1C:
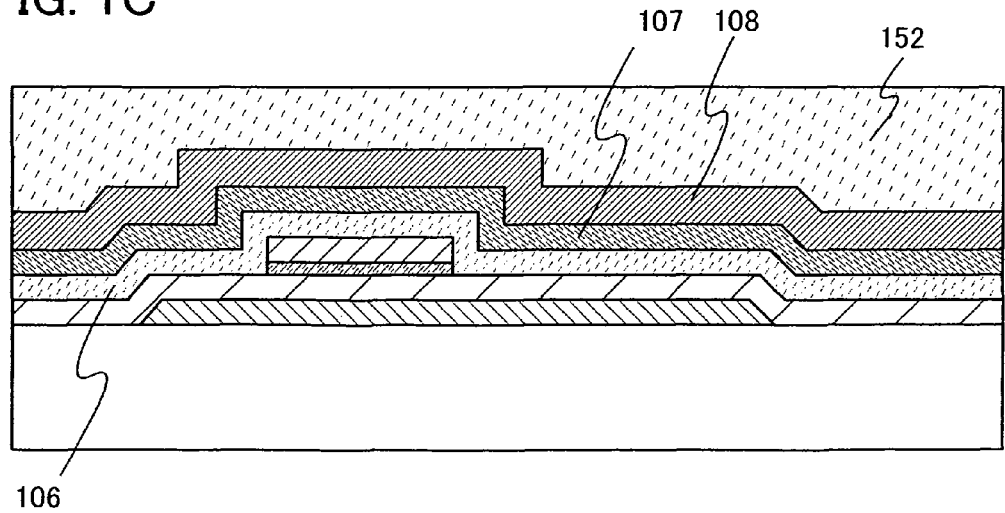
Figure 2A:
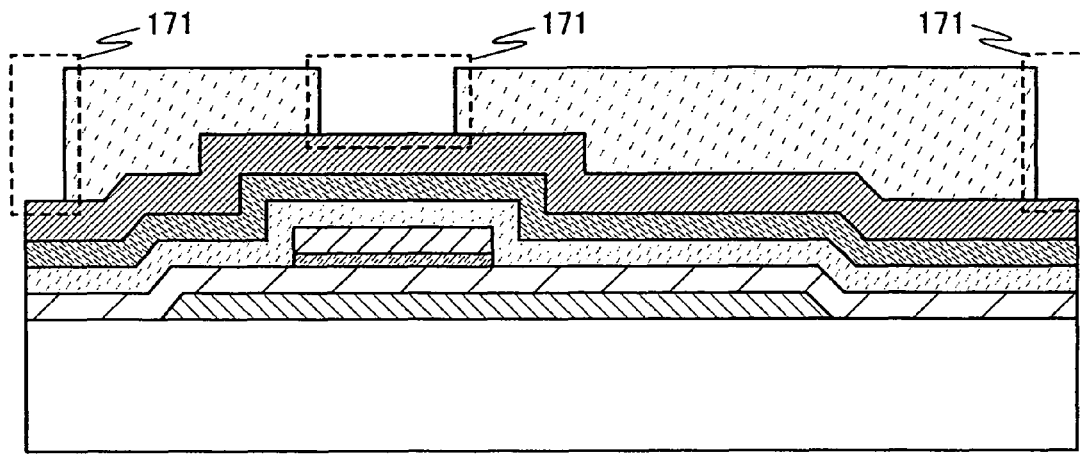
FIGS. 2A to 2C are cross-sectional views illustrating a method for manufacturing a display device of the present invention.
Figure 2B:
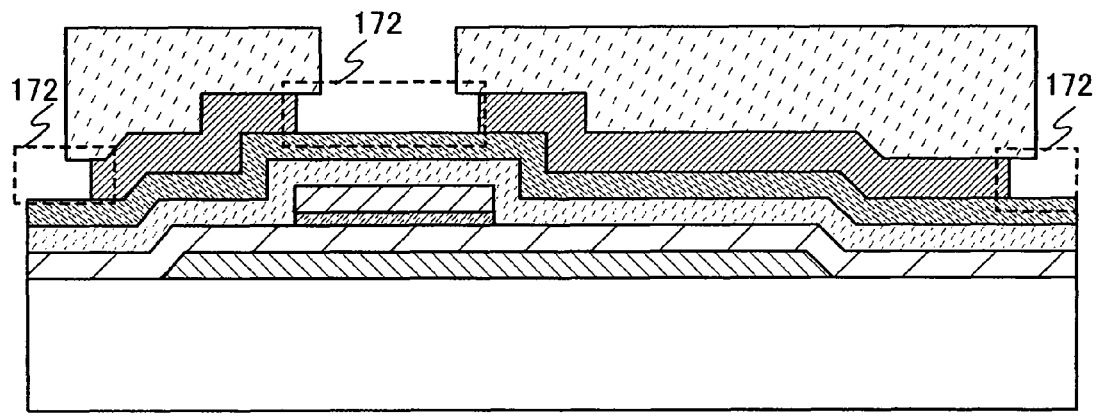
Figure 2C:
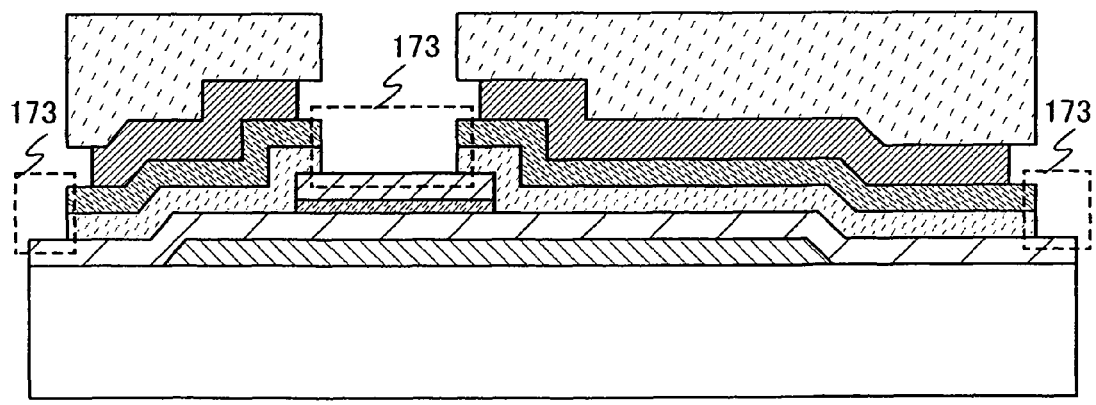

Next, as shown in FIG. 1C, an amorphous semiconductor film 106 is formed so as to cover the island-shaped microcrystalline semiconductor film 105, an impurity semiconductor layer 107 is formed over the amorphous semiconductor film 106, and a conductive film 108 is formed over the impurity semiconductor layer 107. Note that, when the shape of the conductive film 108 is processed, the conductive film 108 serves as a source electrode, a drain electrode, and a wiring of a signal line. For a resist 152, a positive resist or a negative resist can be used. In this embodiment mode, a positive resist is used. A resist mask is formed using a third photomask. As an example, wet etching which is isotropic etching is performed from a hole portion 171 formed in the resist mask, as shown in FIG. 2A in this embodiment mode. Wet etching is performed, whereby a hole portion 172 that is larger than the diameter of the hole portion 171 is formed as shown in FIG. 2B in the conductive film 108 under the hole portion 171. Next, dry etching which is anisotropic etching is performed from the hole portion 171 formed in the resist mask. The dry etching is performed, whereby a hole portion 173 that has almost the same size as the hole portion 171 formed in the resist mask is formed in the impurity semiconductor layer 107 and the amorphous semiconductor film 106 under the hole portion 171. As a result, as shown in FIG. 3A, the end portions of the conductive film 108 to serve as a source electrode and a drain electrode later and the end portions of the impurity semiconductor layer 107 are not aligned with each other (a width 174 in FIG. 3A), and the end portions of the impurity semiconductor layer 107 are formed on an outer side of the end portions of the conductive film 108. As shown in FIG. 3A, the end portions of the conductive film 108 to serve as a source electrode and a drain electrode later and the end portions of the impurity semiconductor layer 107 have the width 174 having a shape in which the end portions of the conductive film 108 and the end portions of the impurity semiconductor layer 107 are not aligned with each other, whereby the distance of end portions of the source electrode and the drain electrode is increased; therefore, leakage current and a short circuit between the source electrode and the drain electrode can be prevented. In addition, the end portions of the conductive film 108 to serve as a source electrode and a drain electrode later and the end portions of the impurity semiconductor layer 107 have the width 174 having a shape in which the end portions of the conductive film 108 and the end portions of the impurity semiconductor layer 107 are not aligned with each other, whereby an electric field is not concentrated on the end portions of the conductive film 108 and the impurity semiconductor layer 107, and leakage current between the gate electrode 101 and the conductive film 108 can be prevented. Accordingly, a thin film transistor with high reliability and high withstand voltage can be formed. Then, the resist mask is removed, and an opening as shown in FIG. 3A can be obtained. Note that FIG. 3A corresponds to a cross-sectional view taken along line A-B of FIG. 5B (however, the gate insulating film 102 is excluded). Note that a signal line 502, a source electrode 108a, and a drain electrode 108b are shown in FIG. 5B, and the signal line 502 and the source electrode 108a are electrically connected to each other.

Note that it is difficult to define which one is referred to as a source electrode or a drain electrode because a source electrode and a drain electrode of a transistor are changed by operating conditions of the transistor, and the like. Thus, in this embodiment mode, an electrode connected to the signal line 502 denotes the source electrode 108a, and an electrode to be connected to a pixel electrode later denotes the drain electrode 108b.

Note that, as shown in FIG. 5B, it is found that the end portions of the impurity semiconductor layer 107 are located outside the end portions of the source electrode 108a and the drain electrode 108b. In addition, one of the source electrode 108a and the drain electrode 108b has a shape that surrounds the other of the source electrode 108a and the drain electrode 108b (specifically, U shape or C shape). Therefore, since the area of a region where carriers move can be increased, the amount of current can be increased and the area of the thin film transistor can be reduced. In addition, the microcrystalline semiconductor film 103, the amorphous semiconductor film 106, the impurity semiconductor layer 107, the source electrode 108a, and the drain electrode 108b are superposed over the gate electrode 101; therefore, an effect of the unevenness of the gate electrode 101 is small and reduction in coverage and generation of leakage current can be suppressed.

The thin film transistor described in this embodiment mode as shown in FIG. 3A is provided with an amorphous semiconductor film on the side surface of an island-shaped microcrystalline semiconductor film. The amorphous semiconductor film has a thickness larger than the microcrystalline semiconductor film that is provided in advance, whereby the parasitic capacitance which is generated between a source electrode and/or a drain electrode and a gate electrode can be reduced. Typically, the amorphous semiconductor film preferably has a thickness of 200 nm or more and 400 nm or less. In addition, carriers (electrons and holes) flowing between the source electrode and the drain electrode of the thin film transistor flow between the source electrode and the drain electrode via the microcrystalline semiconductor film that forms an interface with the gate insulating film near the gate electrode. The thin film transistor has a longer distance in the direction of the thickness of the amorphous semiconductor film where carriers flow than a distance in a channel length direction of the microcrystalline semiconductor film where carriers flow. Accordingly, in a display device provided with a thin film transistor of the present invention, parasitic capacitance which is generated between the source electrode and/or the drain electrode and the gate electrode can be reduced while a good point of the microcrystalline semiconductor film is utilized. In addition, in a display device that has high applied voltage to a gate electrode (e.g., around 15 V), when the thickness of the amorphous semiconductor film is larger than that of the microcrystalline semiconductor film, withstand voltage between a gate electrode and a source electrode and/or a drain electrode is increased and deterioration of a thin film transistor can be suppressed.

The amorphous semiconductor film 106 can be formed by a plasma CVD method using silicon hydride such as $SiH_4$, $Si_2H_6$, or the like. Alternatively, with a dilution of silicon hydride mentioned above with one or plural kinds of noble gas elements selected from helium, argon, krypton, and neon, an amorphous semiconductor film can be formed. With the use of hydrogen at a flow rate which is 1 to 20 times, preferably, 1 to 10 times, more preferably, 1 to 5 times higher than that of silicon hydride, a hydrogen-containing amorphous semiconductor film can be formed. With the use of silicon hydride mentioned above and nitrogen or ammonia, a nitrogen-containing amorphous semiconductor film can be formed. With the use of silicon hydride mentioned above and a gas containing fluorine, chlorine, bromine, or iodine ($F_2$, $Cl_2$, $Br_2$, $I_2$, HF, HCl, HBr, HI, or the like), an amorphous semiconductor film containing fluorine, chlorine, bromine, or iodine can be formed. Note that, in place of silicon hydride, $SiH_2Cl_2$, $SiHCl_3$, $SiCl_4$, $SiF_4$, or the like can be used.

The amorphous semiconductor film 106 has a larger energy gap than the microcrystalline semiconductor film 103 (the energy gap of the amorphous semiconductor film is 1.6 eV to 1.8 eV and the energy gap of the microcrystalline semiconductor film is 1.1 eV to 1.5 eV) and has higher resistance, and has lower mobility, i.e., a fifth to a tenth of that of the microcrystalline semiconductor film. Therefore, in a thin film transistor to be formed later, although part of the amorphous semiconductor film 106 formed between source and drain regions and the microcrystalline semiconductor film functions as a channel formation region, most of the amorphous semiconductor film 106 functions as a high-resistance region and the microcrystalline semiconductor film functions as a channel formation region. Accordingly, the off-current of the thin film transistor can be reduced.

In the case where an n-channel thin film transistor is to be formed, to the impurity semiconductor layer 107 to which an impurity imparting one conductivity type is added, phosphorus may be added as a typical impurity element, and an impurity gas such as $PH_3$ may be added to silicon hydride. In the case where a p-channel thin film transistor is to be formed, boron may be added as a typical impurity element, and an impurity gas such as $B_2H_6$ or the like may be added to silicon hydride. The impurity semiconductor layer 107 to which an impurity imparting one conductivity type is added can be formed of a microcrystalline semiconductor or an amorphous semiconductor. Further, the impurity semiconductor layer 107 to which an impurity imparting one conductivity type is added may be formed using a stacked layer of an amorphous semiconductor film to which an impurity imparting one conductivity type is added and a microcrystalline semiconductor film to which an impurity imparting one conductivity type is added. The impurity semiconductor layer 107 to which an impurity imparting one conductivity type is added is formed at a thickness of 2 nm or more and 50 nm or less. By formation of the semiconductor film to which an impurity imparting one conductivity type is added to a small thickness, throughput can be improved.

It is preferable that the conductive film 108 be formed using a single layer or a stacked layer of aluminum, or a single layer or a stacked layer of an aluminum alloy to which an element to improve heat resistance or an element to prevent a hillock such as copper, silicon, titanium, neodymium, scandium, or molybdenum is added. Alternatively, the conductive film may have a stacked-layer structure where a film on the side in contact with the conductive semiconductor film is formed of titanium, tantalum, molybdenum, tungsten, or nitride of any of these elements and an aluminum film or an aluminum alloy film is formed thereover. Still alternatively, the conductive film may have a stacked-layer structure where an aluminum film or an aluminum alloy film is sandwiched between upper and lower films of titanium, tantalum, molybdenum, tungsten, or nitride of any of these elements. Here, as the conductive film 108, a conductive film in which three conductive films are stacked is given. A stacked-layer conductive film where an aluminum film is sandwiched between molybdenum films and a stacked-layer conductive film where an aluminum film is sandwiched between titanium films can be given as examples. The conductive film is formed by a sputtering method or a vacuum evaporation method.

Note that an impurity element for valence control with respect to the above-described microcrystalline semiconductor film may be added so as to perform doping through the channel protection layer 104 after an etching process is performed on the amorphous semiconductor film 106, the impurity semiconductor layer 107, and the conductive film 108 over the microcrystalline semiconductor film. After an etching process is performed on the amorphous semiconductor film 106, the impurity semiconductor layer 107, and the conductive film 108 over the microcrystalline semiconductor film, an impurity element can be selectively added to the island-shaped microcrystalline semiconductor film 105 to serve as a channel formation region by performing doping through the channel protection layer 104.

Through the above-described steps, a thin film transistor can be formed. In addition, a thin film transistor can be formed using three pieces of photomasks.

Figure 3B:
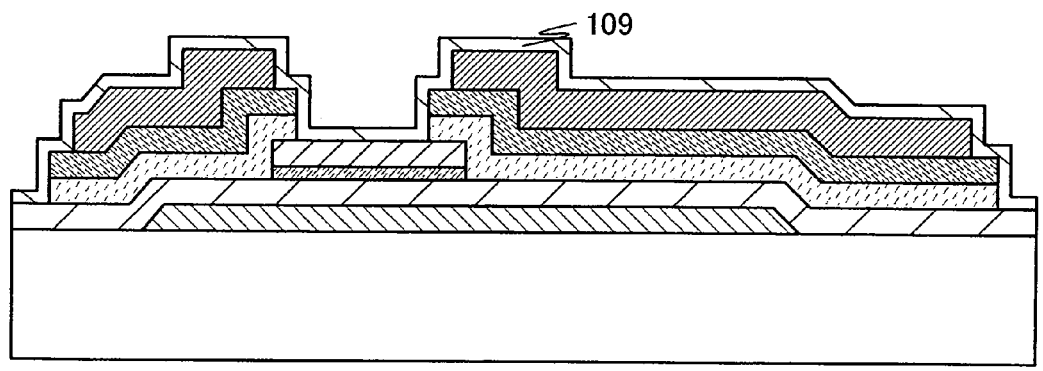

Next, as shown in FIG. 3B, an insulating film 109 is formed over the conductive film 108, the impurity semiconductor layer 107, the amorphous semiconductor film 106, the island-shaped microcrystalline semiconductor film 105, and the gate insulating film 102. The insulating film 109 can be formed in a similar manner to the gate insulating film 102. Note that the insulating film 109 is provided to prevent entry of a contaminant impurity such as an organic substance, a metal substance, or moisture floating in the atmosphere and is preferably a dense film.

Figure 3C:
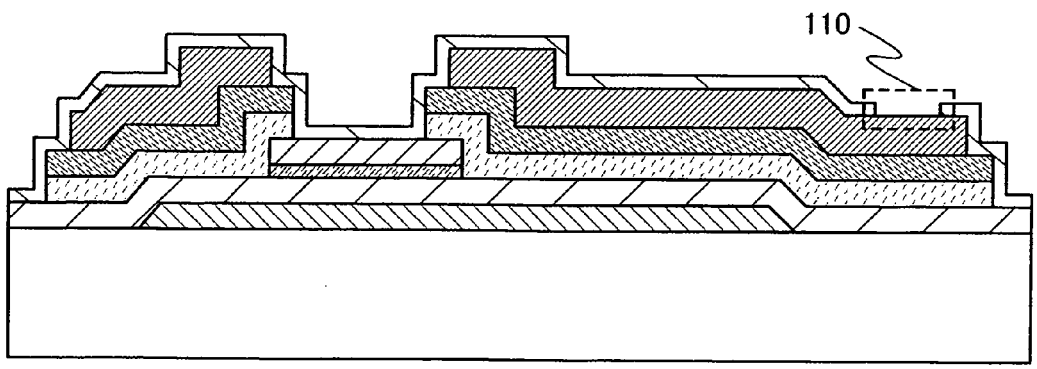

Next, as shown in FIG. 3C, a contact hole 110 is formed in the insulating film 109. Then, a pixel electrode 111 is formed in the contact hole 110 to be in contact with the drain electrode 108b of the conductive film 108, as shown in FIG. 4. Note that FIG. 4 corresponds to a cross-sectional view taken along line A-B of FIG. 5C.

The pixel electrode 111 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the pixel electrode 111 can be formed using a conductive composition containing a conductive high-molecular compound (also referred to as a conductive polymer). It is preferable that the pixel electrode formed using the conductive composition have a sheet resistance of 10,000 Ω/square or less and a light transmittance of 70% or more at a wavelength of 550 nm. In addition, it is preferable that the resistivity of the conductive high-molecular compound contained in the conductive composition be 0.1 Ω·cm or less.

As the conductive high-molecular compound, a so-called π electron conjugated conductive high-molecular compound can be used. Examples include polyaniline and its derivatives, polypyrrole and its derivatives, polythiophene and its derivatives, copolymers of two or more kinds of them, and the like.

As described above, a thin film transistor which can be used for a display device can be obtained. In particular, in a thin film transistor obtained by this embodiment mode suppresses, an increase in parasitic capacitance and an increase in production cost can be suppressed while a decrease in yield can be suppressed, and high electric characteristics and reduction in off-current can be achieved. Therefore, a display device that is driven by a thin film transistor having high reliability of electric characteristics can be obtained.

This embodiment mode can be implemented in combination with any of the structures described in the other embodiment modes, as appropriate.

Embodiment Mode 2

Figure 13:
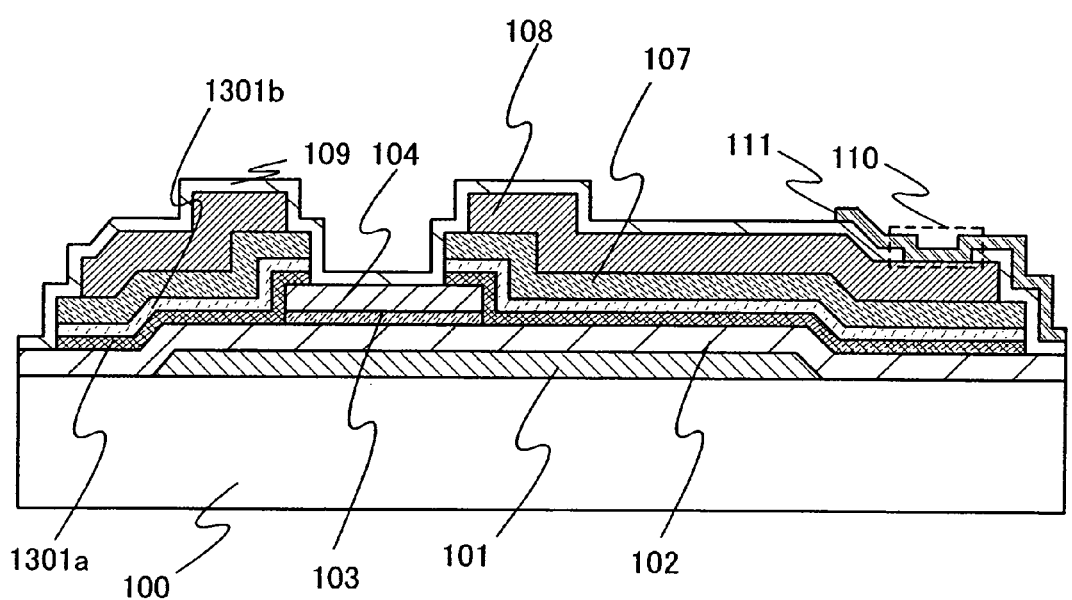
FIG. 13 is a cross-sectional view illustrating a thin film transistor included in a display device of the present invention.

In this embodiment mode, a thin film transistor used for a display device, which is different from that described in Embodiment Mode 1, will be described with reference to FIG. 13. FIG. 13 is a cross-sectional view of a thin film transistor. Note that, in this embodiment mode, portions that are similar to the portions in Embodiment Mode 1 are denoted by the same reference numerals and description is made below with reference to the description of Embodiment Mode 1.

Note that the thin film transistor described in this embodiment mode is an n-channel thin film transistor similarly to the case of Embodiment Mode 1.

First, the gate electrode 101, the gate insulating film 102, the microcrystalline semiconductor film 103, the channel protection layer 104 are formed over the substrate 100, and a state shown in FIG. 1B of Embodiment Mode 1 is obtained by a resist mask and an etching process. The substrate 100, the gate electrode 101, the gate insulating film 102, the microcrystalline semiconductor film 103, and the channel protection layer 104 are the same as those used in Embodiment Mode 1.

Next, as shown in FIG. 13, an amorphous semiconductor film 1301a containing an impurity element that imparts weak p-type conductivity, and an amorphous semiconductor film 1301b to serve as an intrinsic semiconductor are formed. The impurity semiconductor layer 107 and the conductive film 108 are formed over the amorphous semiconductor film 1301b to serve as an intrinsic semiconductor in a similar way to that of Embodiment Mode 1. Note that the amorphous semiconductor film 1301a containing an impurity element that imparts weak p-type conductivity and the amorphous semiconductor film 1301b to serve as an intrinsic semiconductor are formed, and then the impurity semiconductor layer 107 and the conductive film 108 are formed in a similar manner to the amorphous semiconductor film 106 described in Embodiment Mode 1, and a resist mask is formed and an etching process is performed. Then, a thin film transistor as shown in FIG. 13 can be obtained. In addition, the obtained thin film transistor is provided with the insulating film 109 so as to cover the thin film transistor in a similar manner to that in Embodiment Mode 1 and can be electrically connected to the pixel electrode 111 by the contact hole 110.

Electric carriers flowing between a source electrode and a drain electrode of the thin film transistor described in this embodiment mode flow through the conductive film 108 (a source electrode or a drain electrode), the impurity semiconductor layer 107, the amorphous semiconductor film 1301b to serve as an intrinsic semiconductor, the amorphous semiconductor film 1301a containing an impurity element that imparts weak p-type conductivity, the microcrystalline semiconductor film 103, the amorphous semiconductor film 1301a containing an impurity element that imparts weak p-type conductivity, the amorphous semiconductor film 1301b to serve as an intrinsic semiconductor, the impurity semiconductor layer 107, and the conductive film 108 (the source electrode or the drain electrode) in this order. That is, the electric carriers flowing between the source electrode and the drain electrode of the thin film transistor described in this embodiment mode pass through the amorphous semiconductor film 1301a containing an impurity element that imparts weak p-type conductivity to serve as a high-resistance region and the amorphous semiconductor film 1301b to serve as an intrinsic semiconductor. Accordingly, the thin film transistor described in this embodiment mode can reduce leakage current flowing between the source electrode and the drain electrode. Therefore, the thin film transistor described in this embodiment mode can have an effect of reducing leakage current as well as superior electric characteristics described in Embodiment Mode 1.

This embodiment mode can be implemented in combination with any of the structures described in the other embodiment modes, as appropriate.

Embodiment Mode 3

Figure 14:
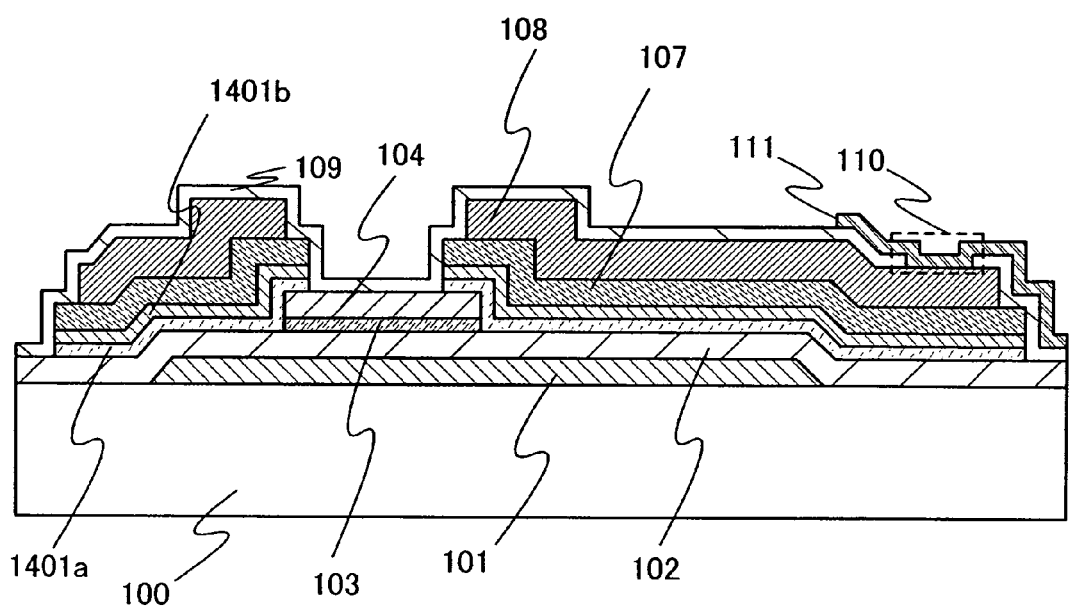
FIG. 14 is a cross-sectional view illustrating a thin film transistor included in a display device of the present invention.

In this embodiment mode, a thin film transistor used for a display device, which is different from those described in Embodiment Mode 1 and Embodiment Mode 2, will be described with reference to FIG. 14. FIG. 14 is a cross-sectional view of a thin film transistor. Note that, in this embodiment mode, portions that are similar to the portions in Embodiment Mode 1 are denoted by the same reference numerals and description is made below with reference to the description of Embodiment Mode 1.

Note that the thin film transistor described in this embodiment mode is an n-channel thin film transistor, similarly to the case of Embodiment Mode 1.

First, the gate electrode 101, the gate insulating film 102, the microcrystalline semiconductor film 103, the channel protection layer 104 are formed over the substrate 100, and a state shown in FIG. 1B of Embodiment Mode 1 is obtained by a resist mask and an etching process. The substrate 100, the gate electrode 101, the gate insulating film 102, the microcrystalline semiconductor film 103, and the channel protection layer 104 are the same as those used in Embodiment Mode 1.

Next, as shown in FIG. 14, an amorphous semiconductor film 1401a to serve as an intrinsic semiconductor and an amorphous semiconductor film 1401b containing an impurity element that imparts weak n-type conductivity, are formed. The impurity semiconductor layer 107 and the conductive film 108 are formed over the amorphous semiconductor film 1401b containing an impurity element that imparts weak n-type conductivity in a similar way to that of Embodiment Mode 1. Note that the amorphous semiconductor film 1401a to serve as an intrinsic semiconductor and the amorphous semiconductor film 1401b containing an impurity element that imparts weak n-type conductivity are formed, and then the impurity semiconductor layer 107 and the conductive film 108 are formed in a similar manner to the amorphous semiconductor film 106 described in Embodiment Mode 1, and a resist mask is formed and an etching process is performed. Then, a thin film transistor as shown in FIG. 14 can be obtained. In addition, the obtained thin film transistor is provided with the insulating film 109 so as to cover the thin film transistor in a similar manner to that in Embodiment Mode 1 and can be electrically connected to the pixel electrode 111 by the contact hole 110.

Electric carriers flowing between a source electrode and a drain electrode of the thin film transistor described in this embodiment mode flow through the conductive film 108 (the source electrode or the drain electrode), the impurity semiconductor layer 107, the amorphous semiconductor film 1401b containing an impurity element that imparts weak n-type conductivity, the amorphous semiconductor film 1401a to serve as an intrinsic semiconductor, the microcrystalline semiconductor film 103, the amorphous semiconductor film 1401a to serve as an intrinsic semiconductor, the amorphous semiconductor film 1401b containing an impurity element that imparts weak n-type conductivity, the impurity semiconductor layer 107, and the conductive film 108 (the source electrode or the drain electrode) in this order. That is, for the electric carriers flowing between the source electrode and the drain electrode of the thin film transistor described in this embodiment mode, leakage current can be decreased because semiconductor films are stacked so as to have high-resistance regions in which resistance gradually increases from the impurity semiconductor layer 107, the amorphous semiconductor film 1401b containing an impurity element that imparts weak n-type conductivity, and the amorphous semiconductor film 1401a to serve as an intrinsic semiconductor; and deterioration of the thin film transistor due to electrons accelerated by a sudden change of voltage because a resistance value gradually increases can be reduced. Accordingly, in this embodiment mode, leakage current flowing between the source electrode and the drain electrode can be reduced, and the life of the thin film transistor can be increased. Therefore, the thin film transistor described in this embodiment mode can have an effect of reducing leakage current as well as superior electric characteristics described in Embodiment Mode 1.

This embodiment mode can be implemented in combination with any of the structures described in the other embodiment modes, as appropriate.

Embodiment Mode 4

In this embodiment mode, a display device having the thin film transistor described in Embodiment Mode 1 will be described below. The display device described in this embodiment mode is described using a liquid crystal display device as an example.

An external view and a cross section of a liquid crystal display panel which is one mode of the liquid crystal display device will be described with reference to FIGS. 7A and 7B. FIG. 7A is a top view of the panel in which a thin film transistor 4010 including a microcrystalline semiconductor film and a liquid crystal element 4013 formed over a first substrate 4001 are sealed between a second substrate 4006 and the first substrate 4001 with a sealant 4005, and FIG. 7B is a cross-sectional view taken along line M-N of FIG. 7A.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed, together with liquid crystal 4008, between the first substrate 4001 and the second substrate 4006 with the sealant 4005. A signal line driver circuit 4003 that is formed using a polycrystalline semiconductor film over a separately prepared substrate is mounted at a region that is different from the region surrounded by the sealant 4005 over the first substrate 4001. In this embodiment mode, an example of attaching the signal line driver circuit including a thin film transistor formed using a polycrystalline semiconductor film to the first substrate 4001 will be described. Alternatively, a signal line driver circuit including a transistor, which is formed using a single-crystalline semiconductor, may be attached to the first substrate 4001. FIG. 7B exemplifies a thin film transistor 4009 formed using a polycrystalline semiconductor film, which is included in the signal line driver circuit 4003.

The pixel portion 4002 and the scan line driver circuit 4004 formed over the first substrate 4001 each include a plurality of thin film transistors, and the thin film transistor 4010 included in the pixel portion 4002 is illustrated as an example in FIG. 7B. The thin film transistor 4010 corresponds to a thin film transistor which uses a microcrystalline semiconductor film and can be formed in a similar manner to the process described in Embodiment Mode 1.

In addition, a pixel electrode 4030 facing the liquid crystal 4008 is electrically connected to the thin film transistor 4010 through a wiring 4040. A counter electrode 4031 of the liquid crystal element 4013 is formed on the second substrate 4006. The liquid crystal element 4013 corresponds to a region where the pixel electrode 4030 and the counter electrode 4031 sandwich the liquid crystal 4008.

Note that, as the first substrate 4001 and the second substrate 4006, glass, metal (typically, stainless steel), ceramics, or plastic can be used. As for plastic, an FRP (fiberglass-reinforced plastics) plate, a PVF (polyvinyl fluoride) film, a polyester film, a polyester film, or an acrylic resin film can be used. In addition, a sheet with a structure in which an aluminum foil is sandwiched between PVF films or polyester films can be used.

In addition, reference numeral 4035 is a spherical spacer which is provided to control the distance (a cell gap) between the pixel electrode 4030 and the counter electrode 4031. Note that a spacer which is obtained by selectively etching an insulating film may be used.

A variety of signals and potential are supplied to the signal line driver circuit 4003 which is separately formed and the scan line driver circuit 4004 or the pixel portion 4002 via wirings 4014 and 4015 from an FPC 4018.

In this embodiment mode, a connection terminal 4016 is formed of the same conductive film as that of the pixel electrode 4030 included in the liquid crystal element 4013. In addition, the wirings 4014 and 4015 are formed of the same conductive film as that of the wiring 4040.

The connection terminal 4016 is electrically connected to a terminal of the FPC 4018 via an anisotropic conductive film 4019.

Although not illustrated, the liquid crystal display device described in this embodiment mode includes an alignment film, a polarizing plate, and further, may include a color filter and a light-blocking film.

Note that FIGS. 7A and 7B illustrate an example in which the signal line driver circuit 4003 is separately formed and mounted on the first substrate 4001, but this embodiment mode is not limited to this structure. The scan line driver circuit may be separately formed and then mounted, or only part of the signal line driver circuit or part of the scan line driver circuit may be separately formed and then mounted.

This embodiment mode can be implemented in combination with any of the structures described in the other embodiment modes, as appropriate.

Embodiment Mode 5

In this embodiment mode, a display device having the thin film transistor described in Embodiment Mode 1 will be described below. The display device described in this embodiment mode is described using a light-emitting device as an example.

Figure 8A:
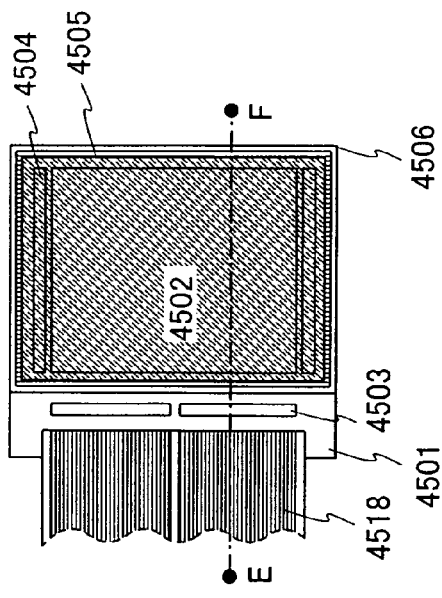
FIGS. 8A and 8B are diagrams illustrating a display device of the present invention.

An external view and a cross section of a light-emitting display panel which is one mode of the light-emitting device will be described with reference to FIGS. 8A and 8B. FIG. 8A is a top view of a panel in which a thin film transistor and a light-emitting element which are formed over a first substrate using a microcrystalline semiconductor film are sealed between the first substrate and a second substrate with a sealant, and FIG. 8B corresponds to a cross-sectional view taken along line E-F of FIG. 8A.

A sealant 4505 is provided so as to surround a pixel portion 4502 and a scan line driver circuit 4504 which are provided over a first substrate 4501. A second substrate 4506 is provided over the pixel portion 4502 and the scan line driver circuit 4504. Therefore, the pixel portion 4502 and the scan line driver circuit 4504 as well as a filler 4507 are sealed between the first substrate 4501 and the second substrate 4506 with the sealant 4505. A signal line driver circuit 4503 that is formed using a polycrystalline semiconductor film over a separately prepared substrate is mounted at a region that is different from the region surrounded by the sealant 4505 over the first substrate 4501. This embodiment mode will describe an example of attaching the signal line driver circuit including a thin film transistor formed using a polycrystalline semiconductor film to the first substrate 4501. Alternatively, a signal line driver circuit including a transistor, which is formed using a single-crystalline semiconductor film, may be attached to the first substrate 4501. FIG. 8B exemplifies a thin film transistor 4509 formed using a polycrystalline semiconductor film, which is included in the signal line driver circuit 4503.

Figure 8B:
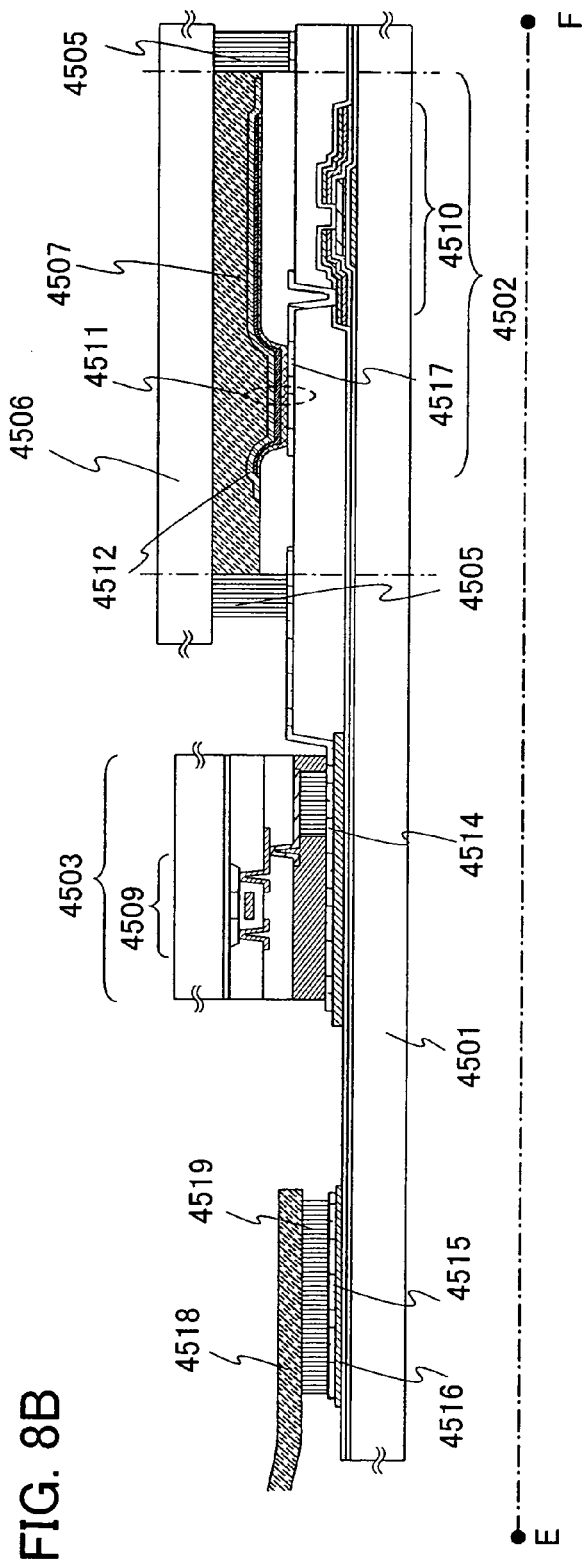

The pixel portion 4502 and the scan line driver circuit 4504 formed over the first substrate 4501 each include a plurality of thin film transistors, and a thin film transistor 4510 included in the pixel portion 4502 is illustrated as an example in FIG. 8B. In this embodiment mode, the thin film transistor 4510 is illustrated as a driving TFT but may also be a current control TFT or an erasing TFT. The thin film transistor 4510 corresponds to a thin film transistor which uses a microcrystalline semiconductor film and can be formed in a similar manner to the process described in Embodiment Mode 1.

In addition, reference numeral 4511 corresponds to a light-emitting element, and a pixel electrode of the light-emitting element 4511 is electrically connected to a source electrode or a drain electrode of the thin film transistor 4510 via a wiring 4517. In this embodiment mode, a common electrode of the light-emitting element 4511 and a light-transmitting conductive material 4512 are electrically connected to each other. Note that a structure of the light emitting element 4511 is not limited to the structure shown in the present embodiment mode. The structure of the light-emitting element 4511 can be changed as appropriate in accordance with a direction of light taken from the light-emitting element 4511, polarity of the thin film transistor 4510, or the like.

Although a variety of signals and potential which are applied to the signal line driver circuit 4503 which is separately formed and the scan line driver circuit 4504 or the pixel portion 4502 are not illustrated in the cross-sectional view of FIG. 8B, the variety of signals and the potential are supplied from an FPC 4518 via wirings 4514 and 4515.

In this embodiment mode, a connection terminal 4516 is formed of the same conductive film as that of the pixel electrode included in the light-emitting element 4511. In addition, the wirings 4514 and 4515 are formed of the same conductive film as that of the wiring 4517.

The connection terminal 4516 is electrically connected to a terminal included in the FPC 4518 through an anisotropic conductive film 4519.

The second substrate in a direction to extract light from the light-emitting element 4511 needs to be transparent. In that case, a light-transmitting material such as a glass plate, a plastic plate, a polyester film, or an acrylic film is used.

As the filler 4507, an inert gas such as nitrogen or argon can be used as well as an ultraviolet curable resin or a heat curable resin such as PVC (polyvinyl chloride), acrylic, polyimide, an epoxy resin, a silicone resin, PVB (polyvinyl butyral), or EVA (ethylene vinyl acetate). In this embodiment mode, nitrogen is used as a filler.

In addition, if needed, optical films, such as a polarizer, a circular polarizer (including an elliptical polarizer), a retardation plate (a quarter-wave plate or a half-wave plate), a color filter, and the like, may be provided on a light-emitting surface of the light-emitting element, as appropriate. Further, a polarizing plate or a circularly polarizing plate may be provided with an anti-reflection film. For example, an anti-glare treatment which can diffuse reflected light with a depression and a projection on the surface, and reduce glare can be performed.

Note that FIGS. 8A and 8B illustrate an example in which the signal line driver circuit 4503 is separately formed and mounted on the first substrate 4501, but this embodiment mode is not limited to this structure. The scan line driver circuit may be separately formed and then mounted, or only part of the signal line driver circuit or part of the scan line driver circuit may be separately formed and then mounted.

This embodiment mode can be implemented in combination with any of the structures described in the other embodiment modes, as appropriate.

Embodiment Mode 6

A structure of a display panel, which is one mode of a display device of the present invention, will be described below.

Figure 9A:
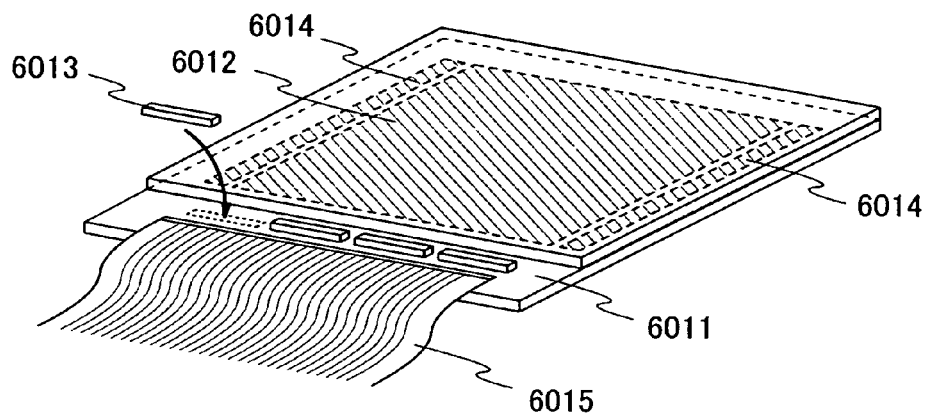
FIGS. 9A to 9C are diagrams illustrating a display device of the present invention.

FIG. 9A shows a mode of a display panel in which a signal line driver circuit 6013 which is separately formed is connected to a pixel portion 6012 formed over a substrate 6011. The pixel portion 6012 and a scan line driver circuit 6014 are each formed using a thin film transistor in which a microcrystalline semiconductor film is used. When the signal line driver circuit is formed using a transistor in which higher mobility can be obtained compared with the thin film transistor in which the microcrystalline semiconductor film is used, an operation of the signal line driver circuit which demands higher driving frequency than that of the scan line driver circuit can be stabilized. Note that the signal line driver circuit 6013 may be formed using a transistor using a single crystalline semiconductor, a thin film transistor using a polycrystalline semiconductor, or a transistor that is formed using an SOI substrate. The pixel portion 6012, the signal line driver circuit 6013, and the scan line driver circuit 6014 are each supplied with a potential of a power supply, a variety of signals, and the like via an FPC 6015.

Note that both the signal line driver circuit and the scan line driver circuit may be formed over the same substrate as the pixel portion.

Figure 9B:
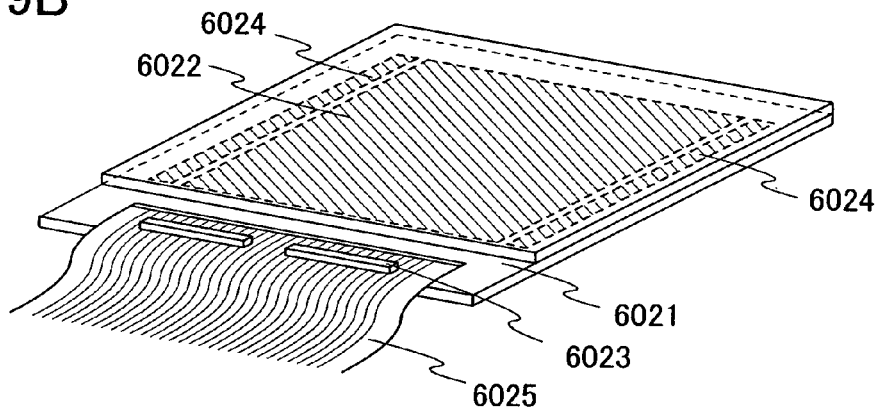

When a driver circuit is separately formed, a substrate over which the driver circuit is formed is not necessarily attached to a substrate over which a pixel portion is formed, and may be attached over an FPC, for example. FIG. 9B shows a mode of a liquid crystal display panel in which a signal line driver circuit 6023 which is separately formed is connected to a pixel portion 6022 and a scan line driver circuit 6024 formed over a substrate 6021. The pixel portion 6022 and the scan line driver circuit 6024 are each formed using a thin film transistor in which a microcrystalline semiconductor film is used. The signal line driver circuit 6023 is connected to the pixel portion 6022 via an FPC 6025. The pixel portion 6022, the signal line driver circuit 6023, and the scan line driver circuit 6024 are each supplied with a potential of a power supply, a variety of signals, and the like via the FPC 6025.

Figure 9C:
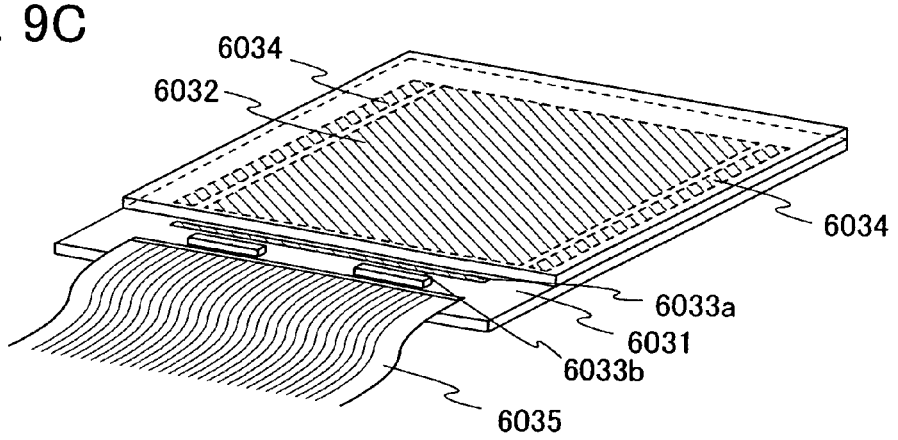

Alternatively, only part of a signal line driver circuit or part of a scan line driver circuit may be formed over the same substrate as a pixel portion by using a thin film transistor in which a microcrystalline semiconductor film is used, and the other part of the driver circuit may be separately formed and electrically connected to the pixel portion. FIG. 9C shows a mode of a liquid crystal display panel in which an analog switch 6033a included in a signal line driver circuit is formed over a substrate 6031, which is the same substrate as a pixel portion 6032 and a scan line driver circuit 6034, and a shift register 6033b included in the signal line driver circuit is separately formed over a different substrate and attached to the substrate 6031. The pixel portion 6032 and the scan line driver circuit 6034 are each formed using a thin film transistor in which a microcrystalline semiconductor film is used. The shift register 6033b included in the signal line driver circuit is connected to the pixel portion 6032 via an FPC 6035. The pixel portion 6032, the signal line driver circuit, and the scan line driver circuit 6034 are each supplied with a potential of a power supply, a variety of signals, and the like via the FPC 6035.

As shown in FIGS. 9A to 9C, in a display device of the present invention, all or a part of the driver circuit can be formed over the same substrate as the pixel portion, using the thin film transistor in which the microcrystalline semiconductor film is used.

Note that there is no particular limitation on a connection method of a substrate which is separately formed, and a known COG method, wire bonding method, TAB method, or the like can be used. Further, a connection position is not limited to the positions shown in FIGS. 9A to 9C as long as electrical connection is possible. Moreover, a controller, a CPU, a memory, or the like may be separately formed and connected.

Note that a signal line driver circuit used in the present invention is not limited to a structure including only a shift register and an analog switch. In addition to the shift register and the analog switch, another circuit such as a buffer, a level shifter, a source follower, or the like may be included. Moreover, the shift register and the analog switch are not necessarily provided. For example, a different circuit such as a decoder circuit by which a signal line can be selected may be used instead of the shift register, or a latch or the like may be used instead of the analog switch.

Figure 10:
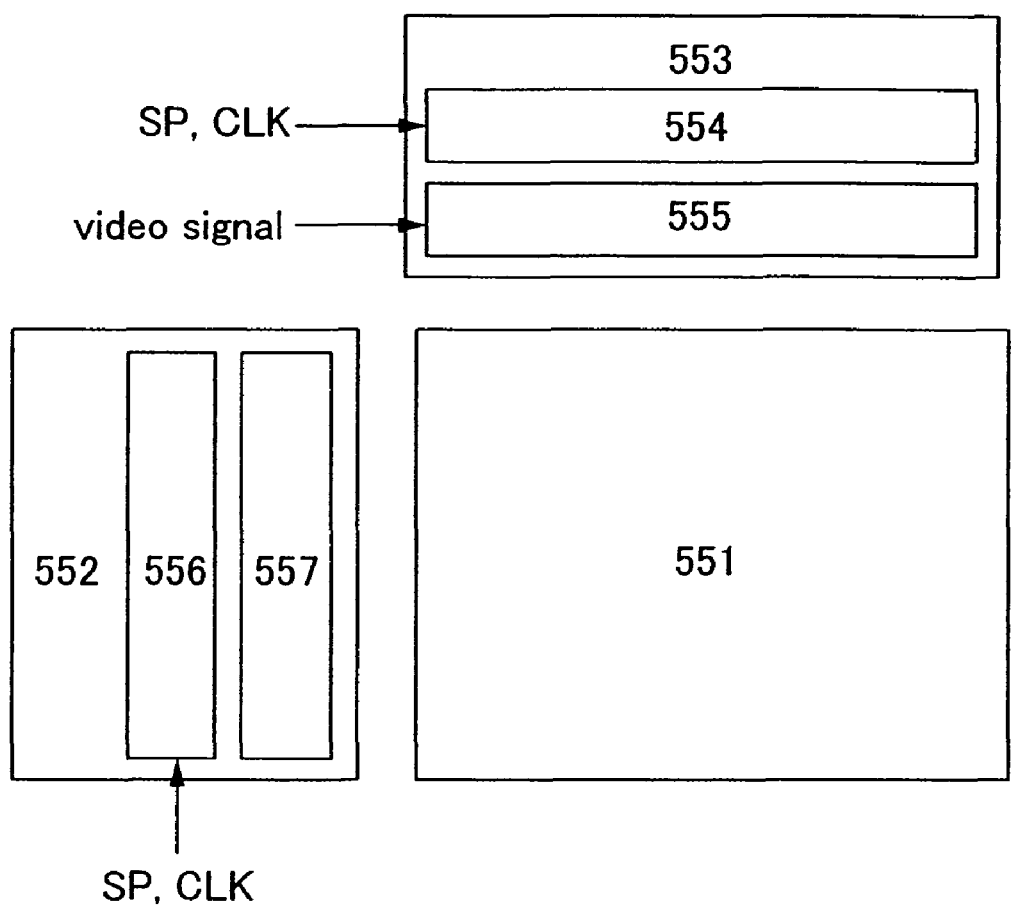
FIG. 10 is a diagram illustrating a display device of the present invention.

FIG. 10 is a block diagram of a liquid crystal display device of the present invention. The liquid crystal display device shown in FIG. 10 includes a pixel portion 551 including a plurality of pixels each provided with a liquid crystal element, a scan line driver circuit 552 which selects each pixel, and a signal line driver circuit 553 which controls input of a video signal to a selected pixel.

In FIG. 10, the signal line driver circuit 553 includes a shift register 554 and an analog switch 555. A clock signal (CLK) and a start pulse signal (SP) are input to the shift register 554. When the clock signal (CLK) and the start pulse signal (SP) are input, a timing signal is generated in the shift register 554 and input to the analog switch 555.

A video signal is supplied to the analog switch 555. The analog switch 555 samples the video signal in accordance with the input timing signal and supplies the resulting signal to a signal line of the next stage.

Next, a structure of the scan line driver circuit 552 is described. The scan line driver circuit 552 includes a shift register 556 and a buffer 557. The scan line driver circuit 552 may also include a level shifter in some cases. In the scan line driver circuit 552, when the clock signal (CLK) and the start pulse signal (SP) are input to the shift register 556, a selection signal is generated. The generated selection signal is buffered and amplified by the buffer 557, and the resulting signal is supplied to a corresponding scan line. Gates of transistors in pixels of one line are connected to the scan line. Further, since the transistors in the pixels of one line have to be turned on at the same time, a buffer through which large current can flow is used as the buffer 557.

In a full color liquid crystal display device, when video signals corresponding to R (red), G (green), or B (blue) are sequentially sampled and supplied to a corresponding signal line, the number of terminals for connecting the shift register 554 and the analog switch 555 corresponds to approximately a third of the number of terminals for connecting the analog switch 555 and the signal line in the pixel portion 551. Accordingly, when the analog switch 555 and the pixel portion 551 are formed over the same substrate, the number of terminals used for connecting substrates which are separately formed can be suppressed compared with the case where the analog switch 555 and the pixel portion 551 are formed over different substrates; thus, occurrence probability of bad connection can be suppressed, and yield can be increased.

Note that, although the scan line driver circuit 552 shown in FIG. 10 includes the shift register 556 and the buffer 557, the scan line driver circuit 552 may be formed using the shift register 556.

Note that structures of the signal line driver circuit and the scan line driver circuit are not limited to the structures shown in FIG. 10, which are merely one mode of the display device of the present invention.

This embodiment mode can be implemented in combination with any of the structures described in the other embodiment modes.

Embodiment Mode 7

The display device obtained by the present invention can be used for an active matrix liquid crystal module. That is, the present invention can be implemented in any of electronic devices having a display portion into which such an active matrix liquid crystal module is incorporated.

Figure 11A:
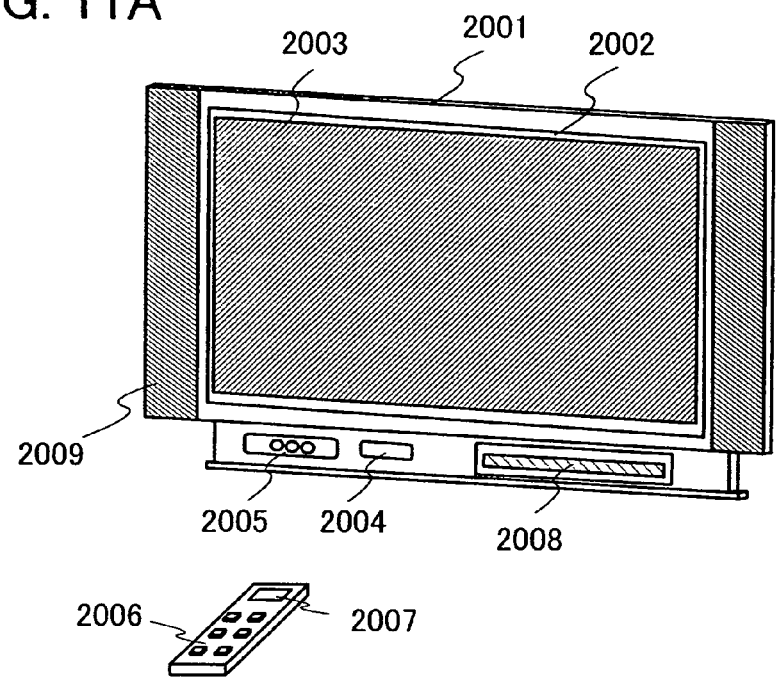
FIGS. 11A to 11C are diagrams illustrating electronic devices including a display device of the present invention.
Figure 11B:
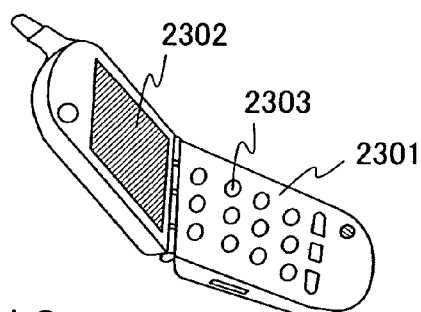
Figure 11C:
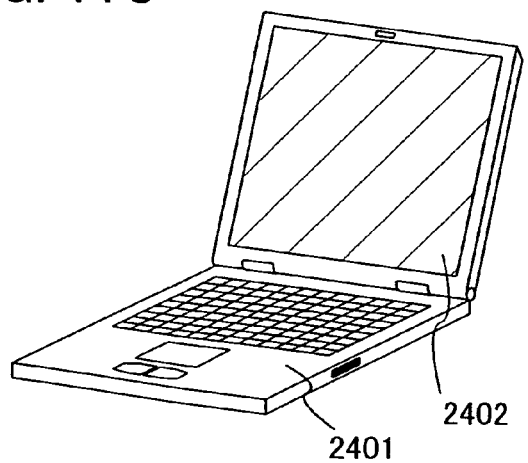

Examples of such electronic devices include cameras such as a video camera and a digital camera, a head-mounted display (a goggle-type display), a car navigation system, a projector, a car stereo, a personal computer, and a portable information terminal (e.g., a mobile computer, a cellular phone, and an e-book reader). FIGS. 11A to 11C show examples of such electronic devices.

FIG. 11A shows a television device. The television device can be completed by incorporating a display module into a housing, as shown in FIG. 11A. A display panel at the stage after an FPC is attached is also referred to as a display module. A main screen 2003 is formed using the display module, and other accessories such as a speaker portion 2009, an operation switch, and the like are provided. Thus, the television device can be completed.

As shown in FIG. 11A, a display panel 2002 using a liquid crystal element is incorporated into a housing 2001. The television device can receive general TV broadcast by a receiver 2005, and can be connected to a wired or wireless communication network via a modem 2004 so that one-way (from a sender to a receiver) or two-way (between a sender and a receiver or between receivers) information communication can be performed. The television device can be operated by a switch incorporated into the housing or a separate remote control unit 2006. The remote control unit may include a display portion 2007 for displaying information to be output.

Further, the television device may include a sub screen 2008 formed using a second display panel for displaying channels, sound volume, and the like, in addition to the main screen 2003. In this structure, the main screen 2003 may be formed using a liquid crystal display panel with an excellent viewing angle, and the sub screen may be formed using a liquid crystal display panel in which display is performed with low power consumption. Alternatively, when reduction in power consumption is prioritized, a structure may be employed in which the main screen 2003 is formed using a liquid crystal display panel, the sub screen is formed using a liquid crystal display panel, and the sub screen can be turned on and off.

Figure 12:
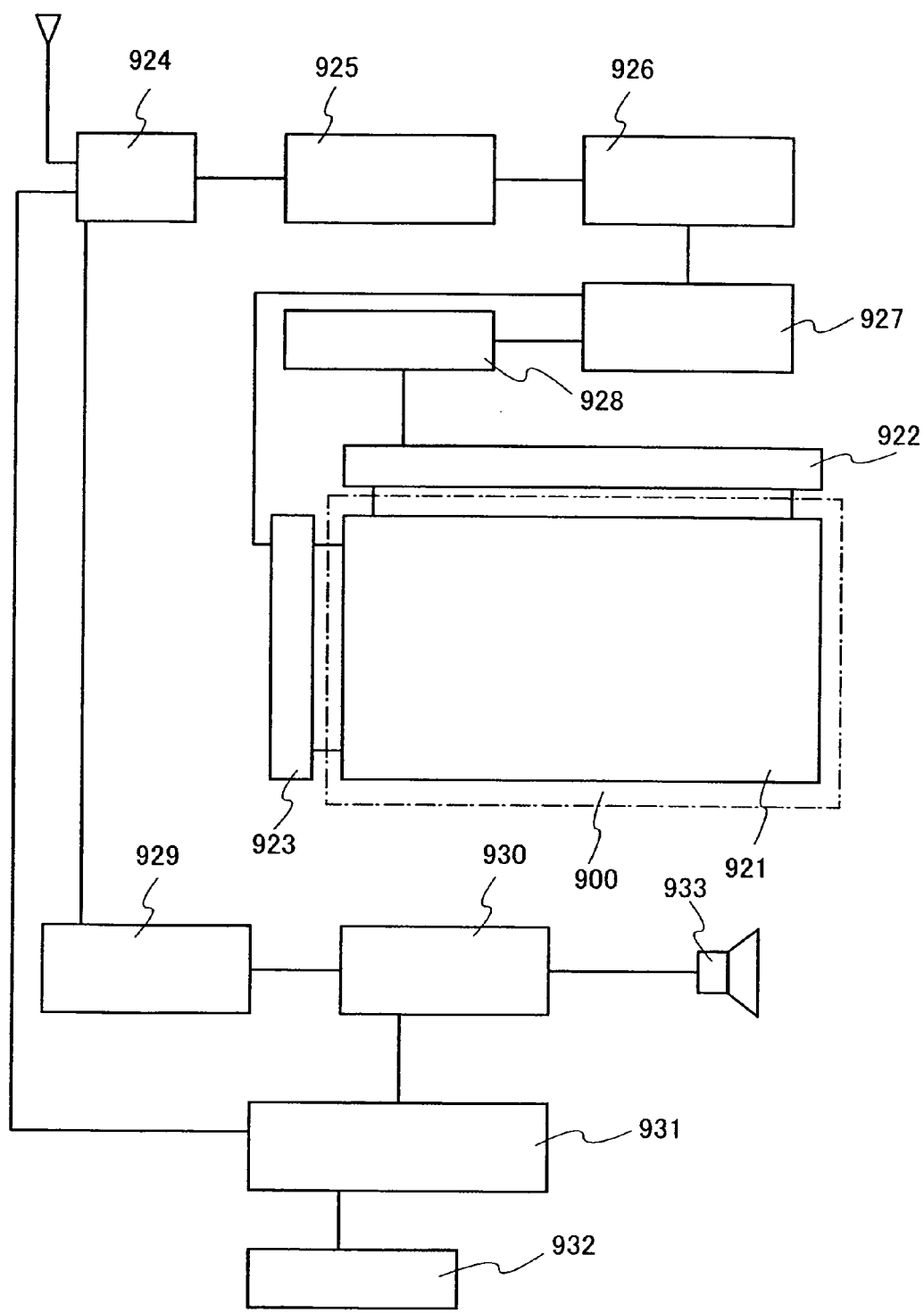
FIG. 12 is a diagram illustrating an electronic device including a display device of the present invention.

FIG. 12 is a block diagram of a main structure of a television device. A display panel 900 is provided with a pixel portion 921. A signal line driver circuit 922 and a scan line driver circuit 923 may be mounted on the display panel 900 by a COG method.

As for other external circuits, the television device includes a video signal amplifier circuit 925 which amplifies a video signal among signals received by a tuner 924; a video signal processing circuit 926 which converts a signal output from the video signal amplifier circuit 925 into a color signal corresponding to each color of red, green, and blue; a control circuit 927 which converts the video signal into an input specification of a driver IC; and the like on an input side of the video signal. The control circuit 927 outputs signals to each of the scan line side and the signal line side. When digital driving is performed, a structure may be employed in which a signal dividing circuit 928 is provided on the signal line side and an input digital signal is divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

It is needless to say that the present invention is not limited to a television device and can be applied to various uses, e.g., a monitor of a computer, a large display medium such as an information display board at the train station, the airport, or the like, or an advertisement display board on the street, and the like.

FIG. 11B shows an example of a cellular phone 2301. The cellular phone 2301 includes a display portion 2302, an operation portion 2303, and the like. When the display device described in the above-described embodiment mode is used for the display portion 2302, mass productivity can be improved.

A portable computer shown in FIG. 11C includes a main body 2401, a display portion 2402, and the like. When the display device described in the above-described embodiment mode is used for the display portion 2402, mass productivity can be improved.

This embodiment mode can be implemented in combination with any of the structures described in the other embodiment modes.

Embodiment Mode 8

Figure 15:
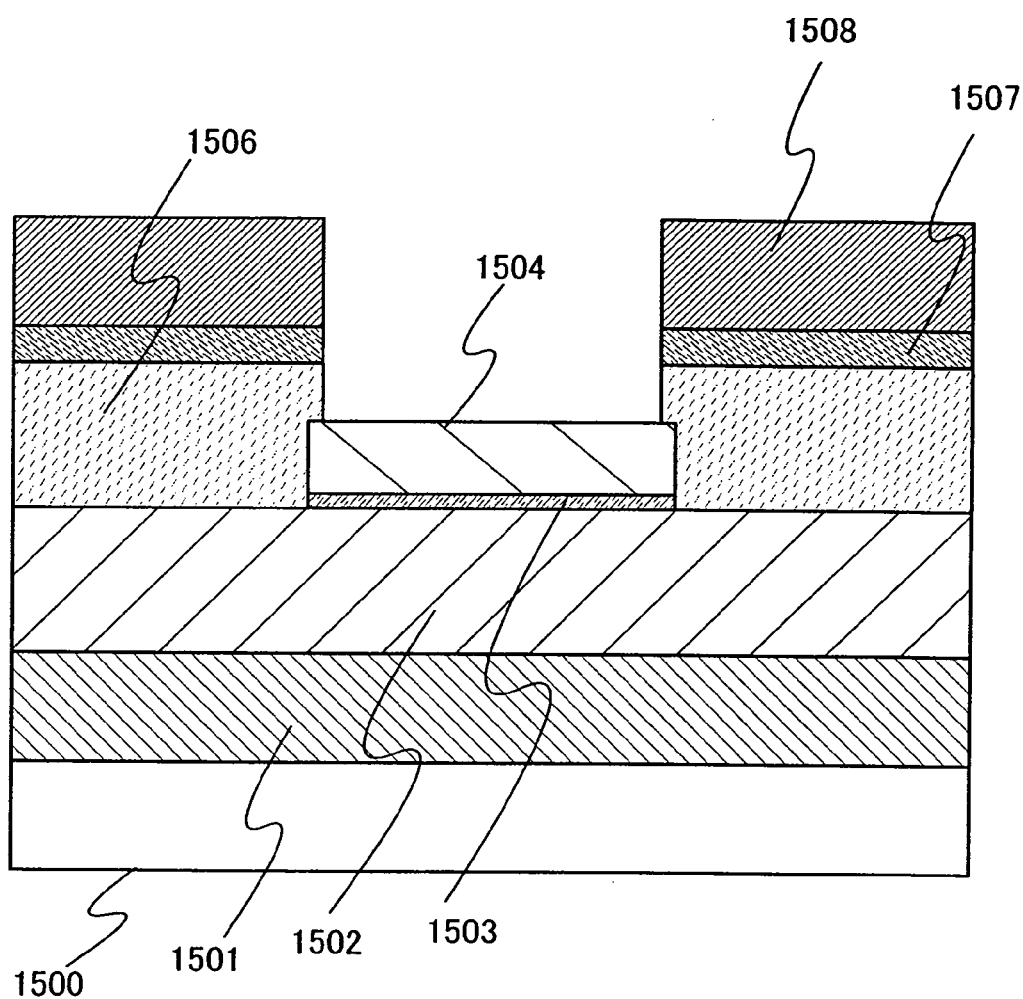
FIG. 15 is a diagram illustrating a cross-sectional structure of a transistor for which simulation calculation is performed.
Figure 16:
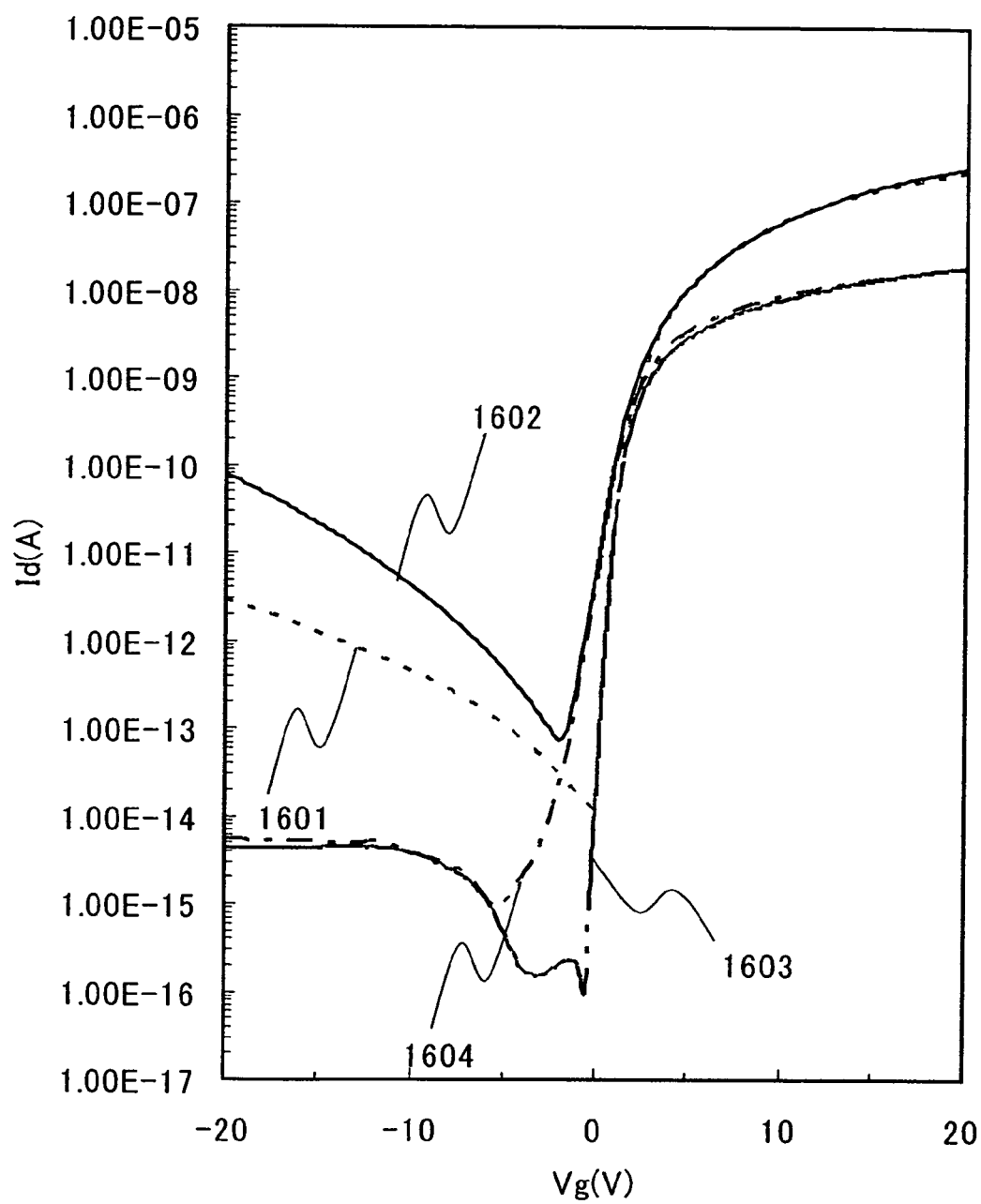
FIG. 16 is a diagram illustrating a current-voltage characteristic of a transistor structure shown in Embodiment Mode 8.

In this embodiment mode, device simulation results of a transistor structure of the present invention described in the above embodiment mode are shown. A transistor structure used for the device simulation is shown in FIG. 15, and current-voltage characteristics of the transistor structure shown in FIG. 15 are shown in FIG. 16. Note that "ATLAS" made by Silvaco Data Systems, Inc. is used for the device simulation.

A stacked structure of the transistor structure shown in FIG. 15 is described. The structure shown in FIG. 15 is formed in such a way that a substrate 1500, a gate electrode 1501, a gate insulating film 1502, a microcrystalline semiconductor film 1503, a channel protection layer 1504, an amorphous semiconductor film 1506, an impurity semiconductor layer 1507, a conductive film (a source electrode and a drain electrode) 1508 are sequentially formed. Note that the manufacturing method described in Embodiment Mode 1 is used. The thickness of each stacked film is set as follows: a glass substrate having a thickness of 100 nm is used for the substrate 1500; a molybdenum (Mo) film having a thickness of 150 nm is used for the gate electrode 1501; a silicon nitride ($Si_3N_4$) film having a thickness of 300 nm is used for the gate insulating film 1502; a silicon film in a microcrystalline state having a thickness of 10 nm is used for the microcrystalline semiconductor film 1503; a silicon nitride ($Si_3N_4$) film having a thickness of 90 nm is used for the channel protection layer 1504; a silicon film in an amorphous state having a thickness of 200 nm is used for the amorphous semiconductor film 1506; an amorphous silicon film having a thickness of 50 nm to which phosphorus is added is used for the impurity semiconductor layer 1507; and a molybdenum (Mo) film having a thickness of 150 nm is used for the conductive film 1508. Note that the length in a channel length direction of the microcrystalline semiconductor film 1503 and the channel protection layer 1504 is set at 10 µm, and the length of the amorphous semiconductor film 1506 which is partly superposed over the end portions of the channel protection layer 1504 is set at 200 nm. In addition, device simulation is performed based on physical characteristics of each stacked film.

Parameters for the device simulation of the amorphous semiconductor film which forms the amorphous semiconductor film 1506 are set at the following numerical values.

The numerical values are as follows: the state density of an acceptor-type defect level (tail distribution) at the conduction band edge satisfies (nta=3.0E21 [/$cm^3$eV]); the state density of a donor-type defect level (tail distribution) at the valence band edge satisfies (ntd=4.0E20 [/$cm^3$eV]); attenuation coefficient of the state density of an acceptor-type defect level (tail distribution) satisfies (wta=0.025 [eV]); attenuation coefficient of the state density of a donor-type defect level (tail distribution) satisfies (wtd=0.05 [eV]); the state density of an acceptor-type defect level (bump distribution) at the peak position satisfies (nga=5.0E17 [/$cm^3$eV]); the state density of a donor-type defect level (bump distribution) at the peak position satisfies (ngd=5.0E17 [/$cm^3$eV]); the peak position of an acceptor-type defect level (bump distribution) satisfies (ega=0.28 [eV]); the peak position of a donor-type defect level (bump distribution) satisfies (egd=0.79 [eV]); the attenuation coefficient of the state density of an acceptor-type defect level (bump distribution) satisfies (wga=0.1 [eV]); the attenuation coefficient of the state density of a donor-type defect level (bump distribution) satisfies (wgd=0.2 [eV]); the capture-cross section for electrons in the tail of an acceptor level satisfies (sigtae=3.0E-15 [$cm^2$]); the capture-cross section for holes in the tail of an acceptor level satisfies (sigtah=3.0E-13 [$cm^2$]); the capture-cross section for electrons in the tail of a donor level satisfies (sigtde=3.0E-13 [$cm^2$]); the capture-cross section for holes in the tail of a donor level satisfies (sigtdh=3.0E-15 [$cm^2$]); the capture-cross section for electrons in a Gaussian distribution of acceptor satisfies (siggae=3.0E-15 [cm$^2$]); the capture-cross section for holes in a Gaussian distribution of acceptor satisfies (siggah=3.0E-13 [cm$^2$]); the capture-cross section for electrons in a Gaussian distribution of donor satisfies (siggde=3.0E-13 [cm$^2$]); and the capture-cross section for holes in a Gaussian distribution of donor satisfies (siggdh=3.0E-15 [cm$^2$]).

Parameters of a silicon film in a microcrystalline state which forms the microcrystalline semiconductor film 1503 are set at the following numerical values. Note that the defect density of the silicon film in a microcrystalline state is set at a tenth of a silicon film in an amorphous state.

The numerical values are as follows: the state density of an acceptor-type defect level (tail distribution) at the conduction band edge satisfies (nta=2.0E21 [/cm$^3$eV]); the state density of a donor-type defect level (tail distribution) at the valence band edge satisfies (ntd=4.0E19 [/cm$^3$eV]); the state density of an acceptor-type defect level (bump distribution) at the peak position satisfies (nga=9.0E17 [/cm$^3$eV]); and the state density of a donor-type defect level (bump distribution) at the peak position satisfies (ngd=5.0E17 [/cm$^3$eV]). Other parameters are the same parameters as those of the amorphous silicon film.

In FIG. 16, device simulation results of the transistor shown in FIG. 15 are shown. A curve 1601 of FIG. 16 shows changes of current (Id) flowing a drain electrode, which corresponds to voltage (Vg) that is applied to a gate electrode when 0 V is applied to a source electrode and 14 V is applied to a drain electrode of the transistor shown in FIG. 15. In addition, a curve 1602 of FIG. 16 shows changes of current (Id) flowing the drain electrode, which corresponds to voltage (Vg) that is applied to the gate electrode when 0 V is applied to the source electrode and 14 V is applied to the drain electrode in the case where the region of the channel protection layer 1504 in FIG. 15 is an amorphous silicon film. In addition, a curve 1603 of FIG. 16 shows changes of current (Id) flowing the drain electrode, which corresponds to voltage (Vg) applied to the gate electrode when 0 V is applied to the source electrode and 1 V is applied to the drain electrode of the transistor shown in FIG. 15. Further, a curve 1604 of FIG. 16 shows changes of current (Id) flowing the drain electrode, which corresponds to voltage (Vg) applied to the gate electrode when 0 V is applied to the source electrode and 1 V is applied to the drain electrode in the case where the region of the channel protection layer 1504 in FIG. 15 is an amorphous silicon film.

From the current-voltage characteristics of the transistor shown in FIG. 16, it is found that, with the transistor structure of the present invention, the amount of current when the transistor is turned off can be decreased without changing the amount of current when the transistor is turned on without depending on voltage between the source electrode and the drain electrode. It is also found that the subthreshold swing (S value) which is a characteristic of Id with respect to Vg is improved in FIG. 16. The improvement of characteristics of this transistor occurs because the thickness of a channel formation region of the transistor is small, whereby S value is improved in a similar way to a complete depletion type transistor; and generation current and recombination current are not generated and the amount of current when the transistor is turned off is decreased because an insulating film is used for the upper part of the channel formation region. As described above, the present invention can provide a display device including a thin film transistor that can improve electric characteristics and decrease off-current. In addition, an increase in parasitic capacitance and an increase in production cost can be suppressed while a decrease in yield can be suppressed.

This application is based on Japanese Patent Application serial No. 2007-205615 filed with Japan Patent Office on Aug. 7, 2007, the entire contents of which are hereby incorporated by reference.

What is claimed is:

1. A display device including a thin film transistor, comprising:
   a gate electrode provided over a substrate;
   a gate insulating film provided over the gate electrode;
   a microcrystalline semiconductor film provided over the gate electrode with the gate insulating film interposed therebetween;
   a channel protection layer provided over the microcrystalline semiconductor film and in contact with the microcrystalline semiconductor film;
   an amorphous semiconductor film provided over the gate insulating film and on a side surface of the microcrystalline semiconductor film and the channel protection layer;
   an impurity semiconductor layer provided over the amorphous semiconductor film; and
   a source electrode and a drain electrode provided over and in contact with the impurity semiconductor layer,
   wherein a thickness of the amorphous semiconductor film is larger than a thickness of the microcrystalline semiconductor film.

2. The display device according to claim 1, wherein the channel protection layer is one of a silicon nitride film and a silicon nitride oxide film.

3. An electronic device comprising the display device according to claim 1.

4. A display device including a thin film transistor, comprising:
   a gate electrode provided over a substrate;
   a gate insulating film provided over the gate electrode;
   a microcrystalline semiconductor film provided over the gate electrode with the gate insulating film interposed therebetween;
   a channel protection layer provided over the microcrystalline semiconductor film and in contact with the microcrystalline semiconductor film;
   an amorphous semiconductor film provided over the gate insulating film and on a side surface of the microcrystalline semiconductor film and the channel protection layer;
   an impurity semiconductor layer provided over the amorphous semiconductor film; and
   a source electrode and a drain electrode provided over and in contact with the impurity semiconductor layer,
   wherein a thickness of the amorphous semiconductor film is larger than a thickness of the microcrystalline semiconductor film,
   wherein a part of the impurity semiconductor layer and a part of the amorphous semiconductor film are exposed outside the source electrode and the drain electrode, and
   wherein one of end portions of the impurity semiconductor layer and one of end portions of the amorphous semiconductor film are aligned with each other over the gate electrode.

5. The display device according to claim 4, wherein the channel protection layer is one of a silicon nitride film and a silicon nitride oxide film.

6. An electronic device comprising the display device according to claim 4.

7. A display device including a thin film transistor, comprising:
   a gate electrode provided over a substrate;
   a gate insulating film provided over the gate electrode;

a microcrystalline semiconductor film provided over the gate electrode with the gate insulating film interposed therebetween;

a channel protection layer provided over the microcrystalline semiconductor film and in contact with the microcrystalline semiconductor film;

an amorphous semiconductor film provided over the gate insulating film and on a side surface of the microcrystalline semiconductor film and the channel protection layer;

an impurity semiconductor layer provided over the amorphous semiconductor film;

a source electrode and a drain electrode provided over and in contact with the impurity semiconductor layer;

an insulating film which is in contact with the source electrode, the drain electrode, the impurity semiconductor layer, and the amorphous semiconductor film; and a pixel electrode provided over the insulating film and connected to one of the source electrode and the drain electrode in a contact hole formed in the insulating film, wherein a thickness of the amorphous semiconductor film is larger than a thickness of the microcrystalline semiconductor film.

8. The display device according to claim 7, wherein the channel protection layer is one of a silicon nitride film and a silicon nitride oxide film.

9. An electronic device comprising the display device according to claim 7.

10. A display device including a thin film transistor, comprising:
a gate electrode provided over a substrate;
a gate insulating film provided over the gate electrode;
a microcrystalline semiconductor film provided over the gate electrode with the gate insulating film interposed therebetween;
a channel protection layer provided over the microcrystalline semiconductor film and in contact with the microcrystalline semiconductor film;
an amorphous semiconductor film provided over the gate insulating film and on a side surface of the microcrystalline semiconductor film and the channel protection layer;
an impurity semiconductor layer provided over the amorphous semiconductor film;
a source electrode and a drain electrode provided over and in contact with the impurity semiconductor layer;
an insulating film which is in contact with the source electrode, the drain electrode, the impurity semiconductor layer, and the amorphous semiconductor film; and
a pixel electrode provided over the insulating film and connected to one of the source electrode and the drain electrode in a contact hole formed in the insulating film,
wherein a thickness of the amorphous semiconductor film is larger than a thickness of the microcrystalline semiconductor film,
wherein a part of the impurity semiconductor layer and a part of the amorphous semiconductor film are exposed outside the source electrode and the drain electrode, and
wherein one of end portions of the impurity semiconductor layer and one of end portions of the amorphous semiconductor film are aligned with each other over the gate electrode.

11. The display device according to claim 10, wherein the channel protection layer is one of a silicon nitride film and a silicon nitride oxide film.

12. An electronic device comprising the display device according to claim 10.

13. A method for manufacturing a display device comprising steps of:
forming a gate electrode over a substrate;
forming a gate insulating film on the gate electrode;
forming a microcrystalline semiconductor layer on the gate electrode with the gate insulating film interposed therebetween;
forming an insulating layer on and in contact with the microcrystalline semiconductor layer;
etching the microcrystalline semiconductor layer and the insulating layer using a mask, thereby forming a microcrystalline semiconductor island and a channel protection layer;
forming an amorphous semiconductor film over the gate insulating film and on a side surface of the microcrystalline semiconductor island and the channel protection layer;
forming an impurity semiconductor layer on the amorphous semiconductor film;
forming a conductive layer on the impurity semiconductor layer; and
etching the conductive layer, the impurity semiconductor layer, and the amorphous semiconductor film, thereby forming source and drain electrodes.

14. The method according to claim 13, wherein a thickness of the amorphous semiconductor film is larger than a thickness of the microcrystalline semiconductor layer.

15. The method according to claim 13, wherein one of end portions of the impurity semiconductor layer and one of end portions of the amorphous semiconductor film are aligned with each other over the gate electrode.

16. A method for manufacturing a display device comprising steps of:
forming a gate electrode over a substrate;
forming a gate insulating film on the gate electrode;
forming a microcrystalline semiconductor layer on the gate electrode with the gate insulating film interposed therebetween;
forming an insulating layer on and in contact with the microcrystalline semiconductor layer;
etching the microcrystalline semiconductor layer and the insulating layer using a mask, thereby forming a microcrystalline semiconductor island and a channel protection layer;
forming an amorphous semiconductor film over the gate insulating film and on a side surface of the microcrystalline semiconductor island and the channel protection layer;
forming an impurity semiconductor layer on the amorphous semiconductor film;
forming a conductive layer on the impurity semiconductor layer;
etching the conductive layer, the impurity semiconductor layer, and the amorphous semiconductor film, thereby forming source and drain electrodes;
forming an insulating film in contact with the source and drain electrodes, the impurity semiconductor layer, and the amorphous semiconductor film; and
forming a pixel electrode over the insulating film, the pixel electrode connected to one of the source and drain electrodes in a contact hole formed in the insulating film.

17. The method according to claim 16, wherein a thickness of the amorphous semiconductor film is larger than a thickness of the microcrystalline semiconductor layer.

18. The method according to claim 16, wherein one of end portions of the impurity semiconductor layer and one of end portions of the amorphous semiconductor film are aligned with each other over the gate electrode.

* * * * *